United States Patent
Saeki

(10) Patent No.: US 10,157,585 B2
(45) Date of Patent: Dec. 18, 2018

(54) OVERDRIVE AMPLIFIER AND SEMICONDUCTOR DEVICE

(71) Applicant: Synaptics Japan GK, Tokyo (JP)

(72) Inventor: Yutaka Saeki, Tokyo (JP)

(73) Assignee: Synaptics Japan GK, Tokyo (JP)

(*) Notice: Subject to any disclaimer, the term of this patent is extended or adjusted under 35 U.S.C. 154(b) by 118 days.

(21) Appl. No.: 15/349,255

(22) Filed: Nov. 11, 2016

(65) Prior Publication Data

US 2017/0140725 A1  May 18, 2017

(30) Foreign Application Priority Data

Nov. 18, 2015 (JP) .................... 2015-225452

(51) Int. Cl.
  *H03F 3/45* (2006.01)
  *G09G 3/36* (2006.01)

(52) U.S. Cl.
  CPC ......... *G09G 3/3648* (2013.01); *G09G 3/3688* (2013.01); *G09G 3/3696* (2013.01); *H03F 3/45219* (2013.01); *H03F 3/45636* (2013.01); *G09G 2300/0819* (2013.01); *G09G 2310/0291* (2013.01); *G09G 2330/021* (2013.01); *H03F 2203/45116* (2013.01); *H03F 2203/45154* (2013.01); *H03F 2203/45674* (2013.01)

(58) Field of Classification Search
  CPC ........................................ H03F 3/45
  USPC .............................. 330/253, 255, 207 A, 261
  See application file for complete search history.

(56) References Cited

U.S. PATENT DOCUMENTS

| 7,342,449 B2* | 3/2008 | Ishii ................. H03F 3/45179 330/253 |
| 7,414,441 B2* | 8/2008 | Lee ..................... H03F 1/301 327/108 |
| 7,443,239 B2* | 10/2008 | Tsuchi ............ H03F 3/45233 330/253 |
| 7,920,025 B2* | 4/2011 | Nishimura ...... H03F 3/45219 330/255 |
| 2003/0006949 A1 | 1/2003 | Sekiya et al. |
| 2006/0028492 A1 | 2/2006 | Yamaguchi et al. |

* cited by examiner

*Primary Examiner* — Henry Choe
(74) *Attorney, Agent, or Firm* — Patterson + Sheridan, LLP

(57) ABSTRACT

The overdrive amplifier may include: a differential input circuit arranged by connecting, in a folded-cascode style, input transistors supplied with an input signal at gates, and feedback input transistors accepting the feedback of an output signal at respective gates; a current mirror load having mirror input current paths connected to current paths of the feedback input transistors, and mirror output current paths connected to current paths of the input transistors; an output circuit accepting the input of output control signals from the mirror output current paths of the current mirror load; and an overdrive circuit which causes bias currents of directions which boost an output of the output circuit, depending on the output control signals, to pass through the current mirror load based on the output control signals in an overdrive period.

18 Claims, 13 Drawing Sheets

PANEL WIRING LOAD

OVERDRIVE AMPLIFIER AND SEMICONDUCTOR DEVICE

CROSS-REFERENCE TO RELATED APPLICATIONS

The Present application claims priority from Japanese application JP 2015-225452 filed on Nov. 18, 2015, the content of which is hereby incorporated by reference into this application.

BACKGROUND

The present invention relates to an overdrive amplifier and a semiconductor device including the same, and it further relates to a technique useful in application to e.g. a drive IC (Integrated Circuit) of LCD (liquid crystal display).

The load-driving performance of a drive amplifier such as a buffer amplifier varies between near and far ends of a load and changes depending on the temperature of the load. For instance, in a liquid crystal display panel, liquid crystal display elements are arrayed in row and column directions like a matrix; gate lines are connected to liquid crystal display element select terminals in units of display lines along the row direction, and source lines are connected to liquid crystal display element data terminals in units of columns along the column direction. In such a display panel, a drive amplifier drives source lines each time a display line is selected. In the source lines, resistance components and liquid crystal display elements' capacitance components are distributed; a load component becomes larger at a farther end. Even if a drive amplifier is caused to work at a high speed, a near end of a load is shorter in convergence time, but it is different from a far end of the load in convergence time under the influence of a panel load, and the far end tends to be late in convergence time. In the case of a large panel load, RC of the panel load becomes dominant in the convergence time at a far end of each load. Therefore, even if the drive amplifier is sped up, it is difficult to achieve a high speed beyond the limitation.

The difference between near and far ends of a load in convergence time in driving comes to the surface depending on the size of a liquid crystal display panel, the quantity of its allowable power consumption, etc. In addition, the difference can arise under a low-temperature environment.

In regard to such difference in convergence time in driving, an overdrive processing to cope with the problem has been known, which is disclosed in e.g. the Japanese Unexamined Patent Application Publication No. JP-A-2006-47767. In the overdrive processing, in the event of change in display gradation, an attempt is made to improve the speed of driving a drive amplifier by activating liquid crystal with drive data which results from the addition of a correction value depending on the quantity of the change to a gradation value concerned. Further, there is a description about an overdrive controller in JP-A-2003-29713, which produces an overdrive voltage for overdrive processing under the control of a logic circuit.

SUMMARY

One embodiment described herein is an overdrive amplifier that includes a differential input circuit comprising differential input transistor pairs arranged by connecting, in a folded-cascode style, input transistors supplied with an input signal at respective first gates, and feedback input transistors configured to accept a feedback of an output signal at respective second gates. The overdrive amplifier includes a current mirror load including mirror input current paths connected to current paths of the feedback input transistors and mirror output current paths connected to current paths of the input transistors and an output circuit configured to receive the input of output control signals from the mirror output current paths of the current mirror load. The amplifier includes an overdrive circuit configured to generate bias currents which boost an output of the output circuit, depending on the output control signals, to pass through the current mirror load based on the output control signals during an overdrive period.

Another embodiment described herein is a semiconductor device formed on a semiconductor substrate that includes a plurality of overdrive amplifiers operated in parallel. The overdrive amplifiers each include a differential input circuit comprising differential input transistor pairs arranged by connecting, in a folded-cascode style, input transistors supplied with an input signal at respective first gates and feedback input transistors accepting the feedback of an output signal at respective second gates. The overdrive amplifiers each include a current mirror load includes mirror input current paths connected to current paths of the feedback input transistors, and mirror output current paths connected to current paths of the input transistors. The overdrive amplifiers each include an output circuit configured to receive the input of output control signals from the mirror output current paths of the current mirror load and an overdrive circuit configured to generate bias currents which boost an output of the output circuit, depending on the output control signals, to pass through the current mirror load based on the output control signals during an overdrive period.

DETAILED DESCRIPTION

Introduction

Figure 1:
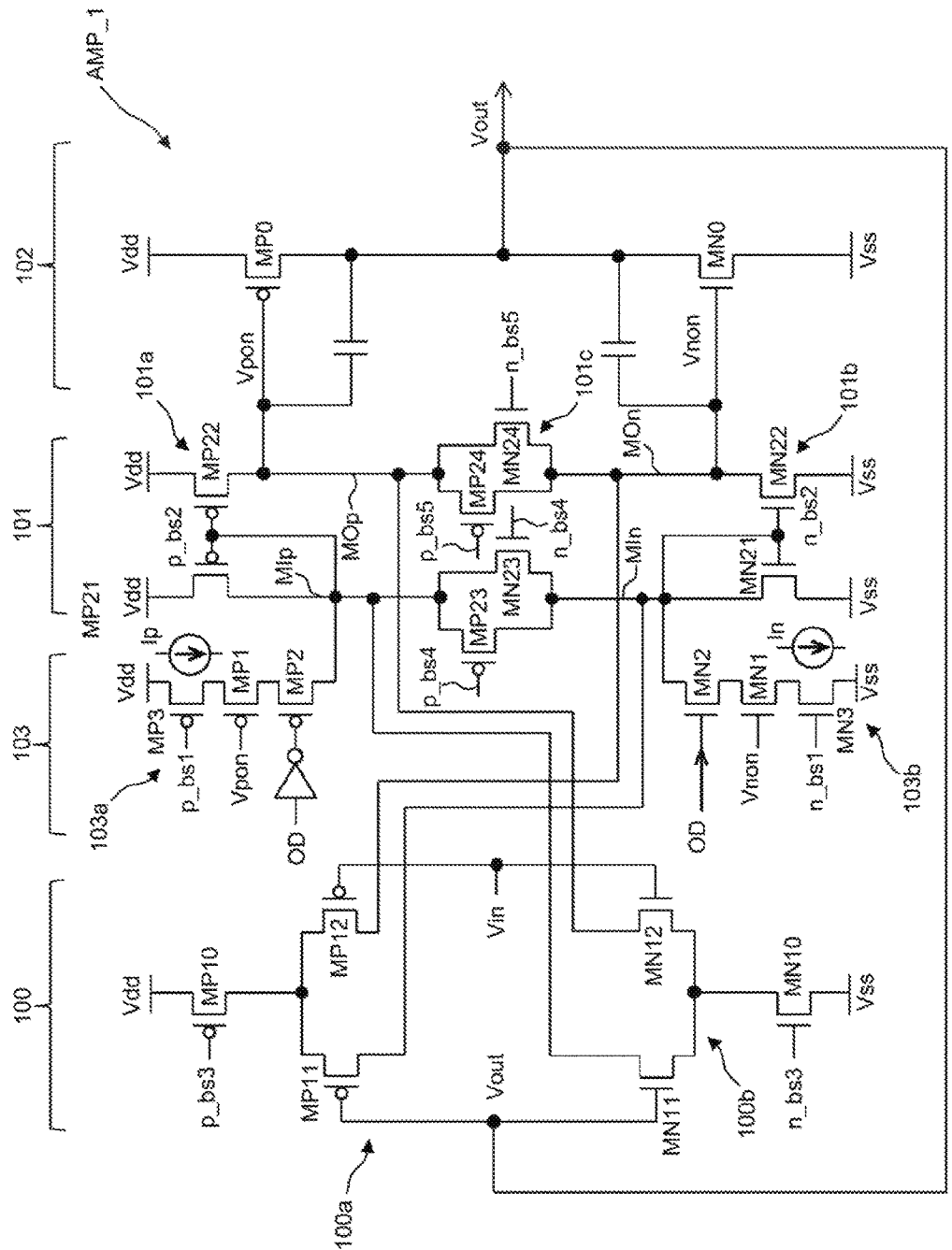
FIG. 1 is a circuit diagram showing an overdrive amplifier according to the first embodiment.

A source amplifier of LCD drive IC is used to drive pixels of a liquid crystal display panel at a higher speed because of the rise in definition of a liquid crystal display panel incorporated in a tablet, a smartphone or the like. Further, if the LCD is in a portable device, low power consumption is desired. Thus, it is difficult to speed up the driving by simply upsizing an amplifier for enhancement in driving performance. In this case, as described in the above Patent Document, it is possible to cope with the problem by correcting drive data by digital processing and overdriving a source amplifier.

However, after the study about this, correcting drive data by digital processing uses a considerable length of time for data sampling and calculation, and there is a limit for enhancement in responsiveness to this correction. Further, an attempt to increase the speed of response by using a single-purpose hardware unit such as an overdrive controller can enlarge the circuit scale and increase the power consumption.

Therefore, it is one object of this disclosure to describe an overdrive technique which enables the achievement of both low current consumption and high-speed driving by adding a small-scale circuit to a drive amplifier.

The above and other objects of this disclosure, and the novel features thereof will become apparent from the description hereof and the accompanying diagrams.

The representative embodiments are briefly outlined below. It is noted that in the respective items below, reference numerals and others in pairs of parentheses for reference to the diagrams are just noted as examples for easier understanding.

[1] Overdrive Circuit (See FIGS. 1, 3, 4, 5 and 7-10)

An overdrive amplifier (AMP_1 to AMP_8) has: a differential input circuit (100) having differential input transistor pairs arranged by connecting, in a folded-cascode style, input transistors (MP12, MN12) supplied with an input signal (Vin) at gates, and feedback input transistors (MP11, MN11) accepting the feedback of an output signal (Vout) at gates; a current mirror load (101) having mirror input current paths (MIp, MIn) connected to current paths of the feedback input transistors, and mirror output current paths (MOp, MOn) connected to current paths of the input transistors; an output circuit (102) accepting the input of output control signals (Vpon, Vnon) from the mirror output current paths of the current mirror load; and an overdrive circuit (103) which causes bias currents (Ip, In) of directions which boost an output of the output circuit, depending on the output control signals, to pass through the current mirror load based on the output control signals in an overdrive period.

According to this embodiment, the differential input circuit, the current mirror load and the output circuit have the function of controlling the negative feedback of an output signal (Vout) corresponding to an input signal (Vin). Specifically, the output signal (Vout) is changed toward a higher voltage direction when Vin>Vout, whereas the output signal (Vout) is changed toward a lower voltage direction when Vi<Vout. On the premise of having the negative feedback control function, the overdrive circuit is arranged to cause the bias currents of directions, which boost the output of the output circuit according to the output control signals, to pass through the current mirror load in an overdrive period. Especially, the bias currents are controlled based on the output control signals in current quantity. In fact, the overdrive amplifier per se can autonomously boost an output of the output circuit to output by the output control signals in an overdrive period. In other words, the overdrive amplifier is arranged to be able to self-regulate an amount of overdriving according to an overdrivable voltage width. Therefore, an overdrive amplifier to be used for minimizing the difference in convergence time between near and far ends of a load, easing the influence of the response characteristic of the load varied according to a temperature environment, and other purposes can be materialized by just adding a small-scale circuit, which enables low current consumption and high-speed driving.

[2] Supplying a Bias Current to the Mirror Input Current Path (See FIGS. 1, 3-5 and 7-10)

In the overdrive amplifier as described in [1], the output circuit has output transistors (MP0, MN0) receiving the output control signals at gates; the overdrive circuit has overdrive transistors (MP1, MN1) controlled in mutual conductance based on the output control signals (Vpon, Vnon), and switch transistors (MP2, MN2) connected in series with the overdrive transistors respectively, which are turned on in the overdrive period; and the overdrive circuit causes each bias current to pass through the mirror input current path of the current mirror load with the corresponding switch transistor in ON state.

According to this embodiment, the voltage of the mirror input current path lowers in case that the bias current is caused to flow as if drawn out from the mirror input current paths of the current mirror load, whereas the voltage of the mirror input current path rises in case that the bias current is caused to flow as if to interflow into the mirror input current path of the current mirror load. This change in the mirror input current path autonomously boosts an output which the output circuit is to output according to the output control signals at that time. The overdrive period is an ON-working period according to switch control by the switch transistors, which can be regulated in time.

[3] Selective Control of Enlarged Amount of Gate-Drain Voltage According to Bias Voltage In the overdrive amplifier as described in [2], the overdrive circuit further includes bias transistors (MP3, MN3) connected in series with the overdrive transistors respectively; and the bias transistors have mutual conductances determined according to voltages of respective bias signals (p_bs1, n_bs1) supplied at their gates.

According to the embodiment like this, the bias currents which the overdrive circuit outputs can be variably controlled in amount of current. The boosting of the output by the output circuit (overdrive voltage) is adjusted by regulating the bias current amounts.

[4] pMOS Current Mirror Circuit and nMOS Current Mirror Circuit (See FIGS. 1, 3-5 and 7-10)

In the overdrive amplifier as described in [3], the current mirror load includes: a pMOS current mirror circuit (101a) connected between a floating current source (101c) and a high-potential power source (Vdd); and an nMOS current mirror circuit (101b) connected between the floating current source and a low-potential power source. The pMOS current mirror circuit has a pMOS mirror input transistor (MP21) and a pMOS mirror output transistor (MP22) which have gates connected commonly and which are composed of p-channel type MOS transistors respectively; and the gate and drain of the pMOS mirror input transistor connected to each other. The nMOS current mirror circuit has an nMOS mirror input transistor (MN21) and an nMOS mirror output transistor (MN22) which have gates connected commonly and which are composed of n-channel type MOS transistors respectively; and the gate and drain of the nMOS mirror input transistor are connected to each other. The output circuit is a push-pull output circuit arranged by connecting a pMOS output transistor (MP0) composed of a p-channel type MOS transistor having a gate connected to a drain of the pMOS mirror output transistor of the pMOS current mirror circuit, and an nMOS output transistor (MN0) composed of an n-channel type MOS transistor having a gate connected to a drain of the nMOS mirror output transistor of the nMOS current mirror circuit, in series with each other.

According to the embodiment like this, an output waveform of the output circuit, directed from the low-potential power source toward the high-potential power source, and an output waveform of the output circuit, directed from the high-potential power source toward the low-potential power source which are symmetrical to each other can be achieved readily.

[5] Coupling the pMOS Overdrive Circuit with the pMOS Current Mirror Circuit, and the nMOS Overdrive Circuit with the nMOS Current Mirror Circuit (See FIGS. 1 and 3-5)

In the overdrive amplifier as described in [4], the overdrive circuit has: a pMOS overdrive circuit (103a, 103c) connected between the drain of the pMOS mirror input transistor included in the pMOS current mirror circuit, and the high-potential power source; and an nMOS overdrive circuit (103b, 103d) connected between the drain of the nMOS mirror input transistor included in the nMOS current mirror circuit, and the low-potential power source. The pMOS overdrive circuit has, as the overdrive transistor, the switch transistor and the bias transistor, a pMOS overdrive transistor (MP1), a pMOS switch transistor (MP2) and a pMOS bias transistor (MP3) which are formed by p-channel type MOS transistors respectively. The nMOS overdrive circuit has, as the overdrive transistor, the switch transistor and the bias transistor, an nMOS overdrive transistor (MN1), an nMOS switch transistor (MN2) and an nMOS bias transistor (MN3) which are formed by n-channel type MOS transistors respectively.

In one embodiment, the pMOS overdrive circuit (103a) acts to lower the drain voltage of the mirror current output path by supplying current to mirror current input path of the pMOS current mirror circuit (101a) current and thus, enlarges the mutual conductance of the pMOS output transistor (MP0), whereby an output of High level which the output circuit (102) is to output is autonomously boosted toward a higher potential side. In addition, the nMOS overdrive circuit (103b) acts to raise the drain voltage of the mirror output current path by causing current to flow in a direction in which the current is drawn out from the mirror input current path of the nMOS current mirror circuit (101b) and thus, enlarges the mutual conductance of the nMOS output transistor (MN0), whereby an output of Low level which the output circuit (102) is to output is autonomously boosted toward a lower potential side.

Figure 3:
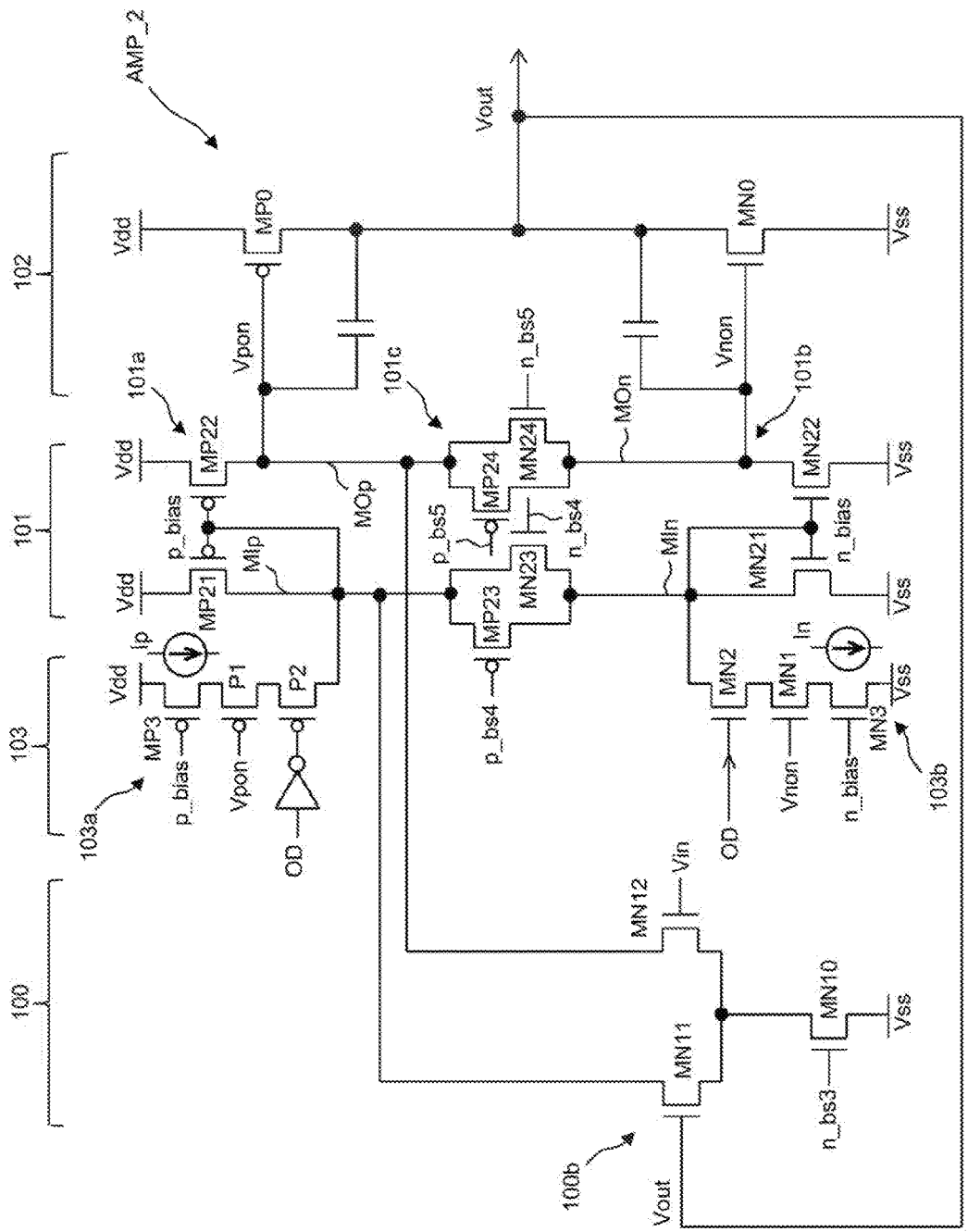
FIG. 3 is a circuit diagram showing an overdrive amplifier according to the second embodiment.
Figure 4:
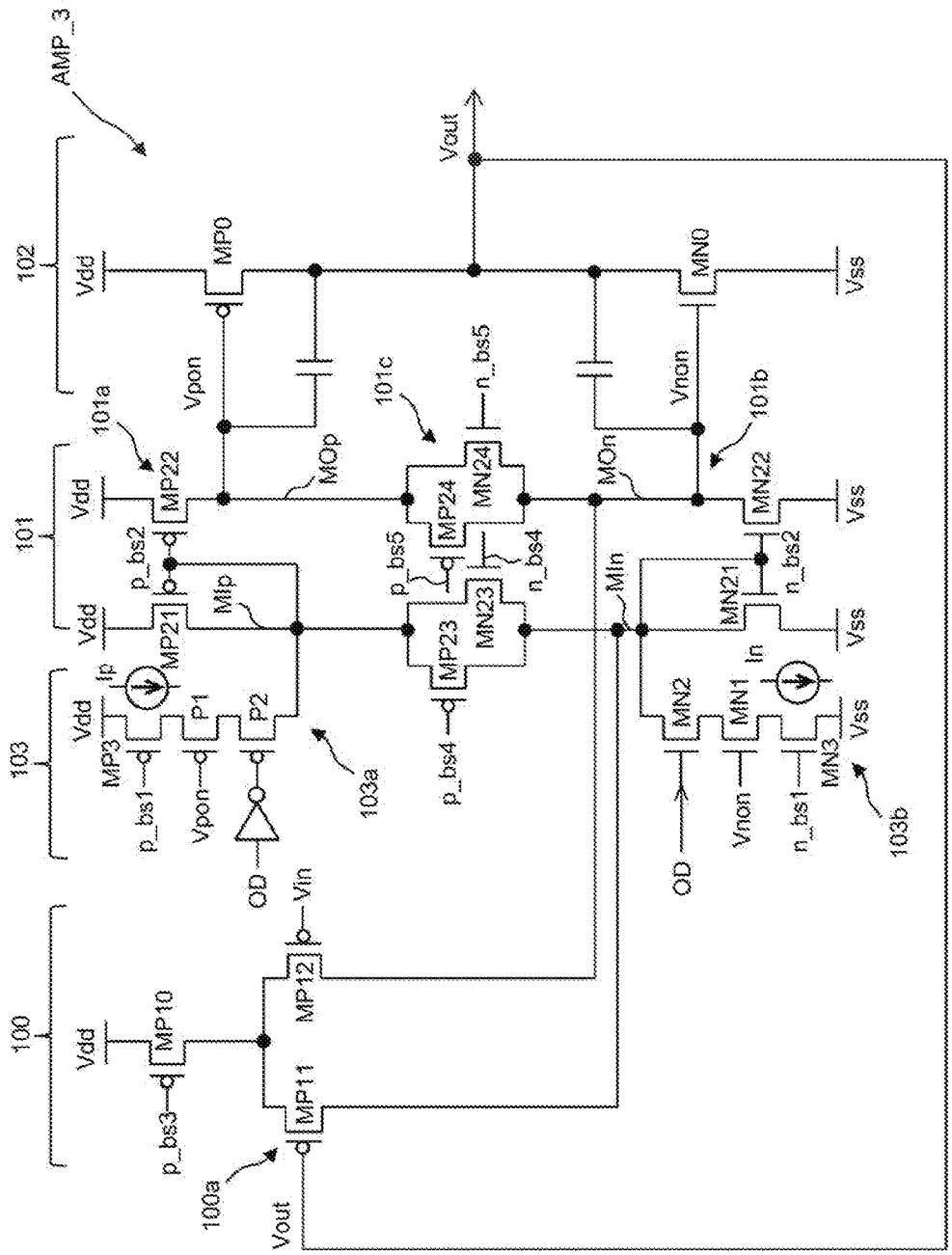
FIG. 4 is a circuit diagram showing an overdrive amplifier according to the third embodiment.

[6] Direct Control of Switch Transistors by Overdrive Control Signal (See FIGS. 1, 3 and 4)

In the overdrive amplifier as described in [5], the pMOS switch transistor (MP2) of the pMOS overdrive circuit (103a) accepts the input of an inverted signal of an overdrive control signal (OD) at its gate. The nMOS switch transistor (MN2) of the nMOS overdrive circuit (103b) accepts the input of the overdrive control signal at its gate.

In one embodiment, the overdrive period can be controlled by the overdrive control signal.

Figure 5:
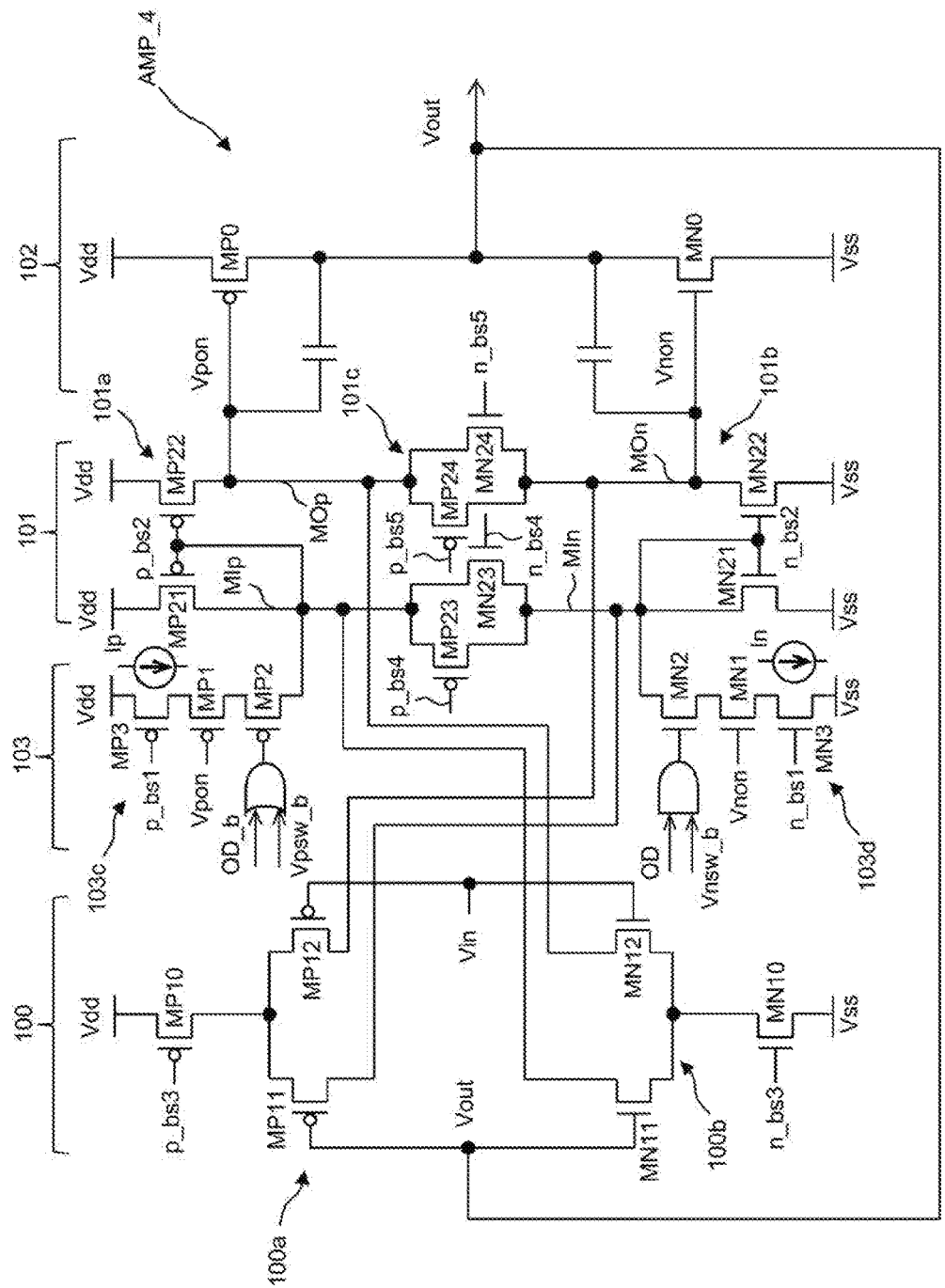
FIG. 5 is a circuit diagram showing an overdrive amplifier according to the fourth embodiment.
Figure 6:
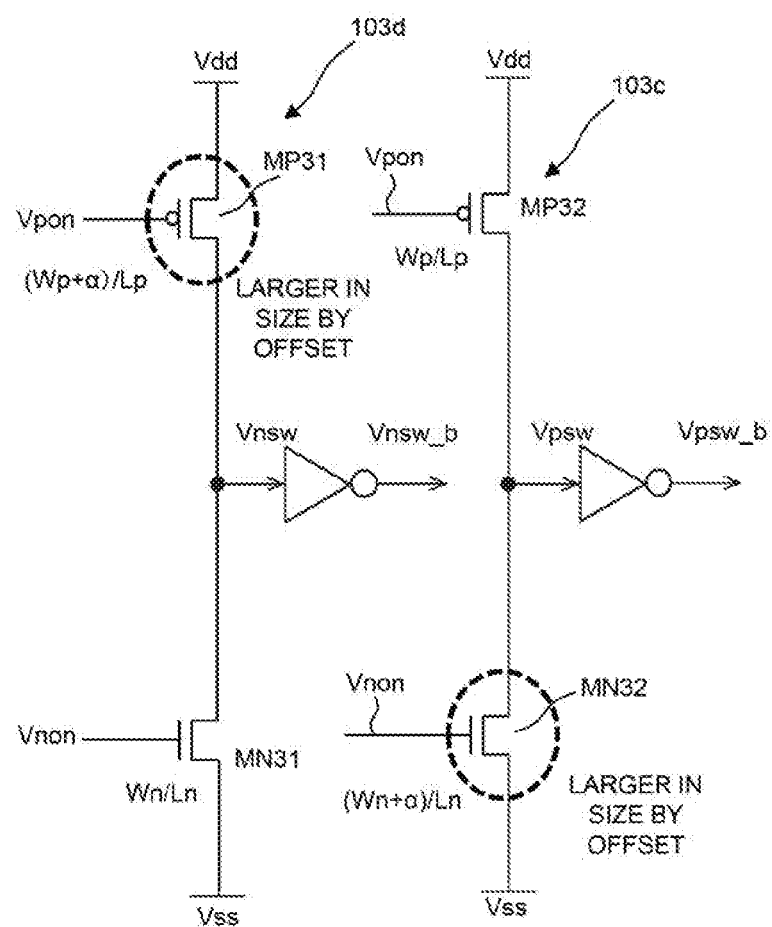
FIG. 6 is a circuit diagram showing, by example, a control-signal-generation logic to prevent an overdrive current from flowing through both of a pMOS overdrive circuit and an nMOS overdrive circuit immediately after the start of the overdriving.

[7] Exclusive Control of Switch States of pMOS and nMOS Switch Transistors (See FIGS. 5 and 6)

In the overdrive amplifier as described in [5], the pMOS switch transistor (MP2) of the pMOS overdrive circuit (103c) accepts the input of a logical OR signal of an inverted signal (OD_b) of an overdrive control signal and a first switch control signal (Vpsw_b) at its gate; and the nMOS switch transistor (MN2) of the nMOS overdrive circuit (103d) accepts the input of a logical AND signal of the overdrive control signal (OD) and a second switch control signal (Vnsw_b) at its gate. The first switch control signal is a signal which is changed to Low level later than a gate signal of the pMOS output transistor (MP0) composed of the p-channel type MOS transistor, and changed to High level earlier than the gate signal; and the second switch control signal is a signal which is changed to Low level earlier than a gate signal of the nMOS output transistor (MN0) composed of the n-channel type MOS transistor, and changed to High level later than the gate signal. That is, the first switch control signal turns off MP2 earlier than the change in Vpon, and turns on MP2 later than the change. The second switch control signal turns off MN2 earlier than the change in Vnon, and turns on MN2 later than the change.

In the case of directly controlling the switch transistors (MP2, MN2) by an overdrive control signal as in the overdrive amplifier as described in [6], the switch transistors are both turned on after start of overdriving. So the overdrive transistors (MP1, MN1) can be both turned on depending on voltages of the output control signals (Vpon, Vnon) to cause the bias currents (Ip, In) to flow even in any of the cases of Vin>Vout and Vin<Vout. As an originally intended output-boosting function, it is efficient to cause only the bias current Ip to flow under the condition of Vin>Vout, and to cause only the bias current In to flow under the condition of Vin<Vout after start of overdriving. Therefore, arranging the overdrive amplifier to turn on only the pMOS switch transistor (MP2) under the condition of Vin>Vout, and turn on only the nMOS switch transistor (MN2) under the condition of Vin<Vout as described in [7], any one of the bias currents Ip and In can be caused to flow. Especially, in the overdrive amplifier arranged so, the first switch control signal, which is changed to Low level later than a gate signal of the pMOS output transistor (MP0), is used to start passing the bias current Ip through the pMOS overdrive circuit, and the second switch control signal, which is changed to High level later than the gate signal of the nMOS output transistor (MN0), is used to start passing the bias current In through the nMOS overdrive circuit. Thus, the occurrence of such a malfunction that the direction of overdriving is reversed immediately after start of the overdriving, i.e. a situation in which the bias current In is caused to flow when to pass the bias current Ip, or reversely the bias current Ip is caused to flow when to pass the bias current In can be prevented. In fact, it is possible to avoid erroneous overdriving immediately after start of overdriving.

[8] P-Channel Type Differential Input Transistor Pair and N-Channel Type Differential Input Transistor Pair (See FIGS. 1 and 5)

In the overdrive amplifier as described in [5], the differential input circuit includes, as the differential input transistor pairs, a pMOS differential input transistor pair (100a) connected between the high-potential power source and the nMOS current mirror circuit, and an nMOS differential input transistor pair (100b) connected between the low-potential power source and the pMOS current mirror circuit. The pMOS differential input transistor pair includes, as the input transistor and the feedback input transistor, a pMOS input transistor (MP12) and a pMOS feedback input transistor (MP11) which are composed of p-channel type MOS transistors respectively; the pMOS input transistor has a drain connected to the drain of the nMOS mirror output transistor (MN22); and the pMOS feedback input transistor has a drain connected to the drain of the nMOS mirror input transistor (MN21). The nMOS differential input transistor pair includes, as the input transistor and the feedback input transistor, an nMOS input transistor (MN12) and an nMOS feedback input transistor (MN11) which are composed of n-channel type MOS transistors respectively; the nMOS input transistor has a drain connected to the drain of the pMOS mirror output transistor (MP22); and the nMOS feedback input transistor has a drain connected to the drain of the pMOS mirror input transistor (MP21).

In one embodiment, the state of the nMOS current mirror circuit can be decided according to an input to the pMOS differential input transistor pair, and the state of the pMOS current mirror circuit can be decided according to an input to the nMOS differential input transistor pair. Therefore, a high responsiveness can be achieved concerning the negative feedback control of the output signal (Vout) corresponding to the input signal (Vin).

[9] P-Channel Type Differential Input Transistor Pair (See FIG. 4)

In the overdrive amplifier as described in [5], the differential input transistor pair of the differential input circuit is a pMOS differential input transistor pair connected between the high-potential power source and the nMOS current mirror circuit. The pMOS differential input transistor pair includes, as the input transistor and the feedback input transistor, a pMOS input transistor and a pMOS feedback input transistor composed of p-channel type MOS transistors respectively; the pMOS input transistor has a drain connected to the drain of the nMOS mirror output transistor; and the pMOS feedback input transistor has a drain connected to the drain of the nMOS mirror input transistor.

This embodiment can lower the responsiveness of the negative feedback control from a low potential output to a high potential output in comparison to the overdrive amplifier as described in [8], but it can contribute to the reduction in circuit scale.

[10] N-Channel Type Differential Input Transistor Pair (See FIG. 3)

In the overdrive amplifier as described in [5], the differential input transistor pair of the differential input circuit is an nMOS differential input transistor pair connected between the low-potential power source and the pMOS current mirror circuit. The nMOS differential input transistor pair includes, as the input transistor and the feedback input transistor, an nMOS input transistor and an nMOS feedback input transistor composed of n-channel type MOS transistors respectively; the nMOS input transistor has a drain connected to the drain of the pMOS mirror output transistor; and the nMOS feedback input transistor has a drain connected to the drain of the pMOS mirror input transistor.

This embodiment can lower responsiveness of the negative feedback control from a high potential output to a low potential output in comparison to the overdrive amplifier as described in [8], but it can contribute to the reduction in circuit scale.

[11] Couple the nMOS Overdrive Circuit to a pMOS Current Mirror Circuit, and the pMOS Overdrive Circuit to the nMOS Current Mirror Circuit (See FIGS. 7-10)

In the overdrive amplifier as described in [4], the overdrive circuit has: an nMOS overdrive circuit (103f, 103h) connected between the drain of the pMOS mirror input transistor (MP21) included in the pMOS current mirror circuit (101a) and the low-potential power source (Vss); and a pMOS overdrive circuit (103e, 103g) connected between the drain of the nMOS mirror input transistor (MN21) included in the nMOS current mirror circuit (101b) and the high-potential power source (Vdd). The pMOS overdrive circuit has, as the overdrive transistor, the switch transistor and the bias transistor, a pMOS overdrive transistor (MP1), a pMOS switch transistor (MP2) and a pMOS bias transistor (MP3) formed by p-channel type MOS transistors respectively. The nMOS overdrive circuit has, as the overdrive transistor, the switch transistor and the bias transistor, an nMOS overdrive transistor (MN1), an nMOS switch transistor (MN2) and an nMOS bias transistor (MN3) formed by n-channel type MOS transistors respectively.

In one embodiment, the pMOS overdrive circuit (103e, 103g) works to lower the drain voltage of the mirror current output path (MOn) by supplying current to the mirror current input path of the nMOS current mirror circuit (101b) and thus, decreases the mutual conductance of the nMOS output transistor (MN0), whereby an output of High level which the output circuit (102) is to output is autonomously boosted toward a higher potential side. In addition, the nMOS overdrive circuit (103f, 103h) acts so as to raise the drain voltage of the mirror current output path by causing current to flow in a direction in which current is drawn out from the mirror current input path of the pMOS current mirror circuit (101a) and thus, decreases the mutual conductance of the pMOS output transistor (MP0), whereby an output of Low level which the output circuit (102) is to output is autonomously boosted toward a lower potential side.

Figure 7:
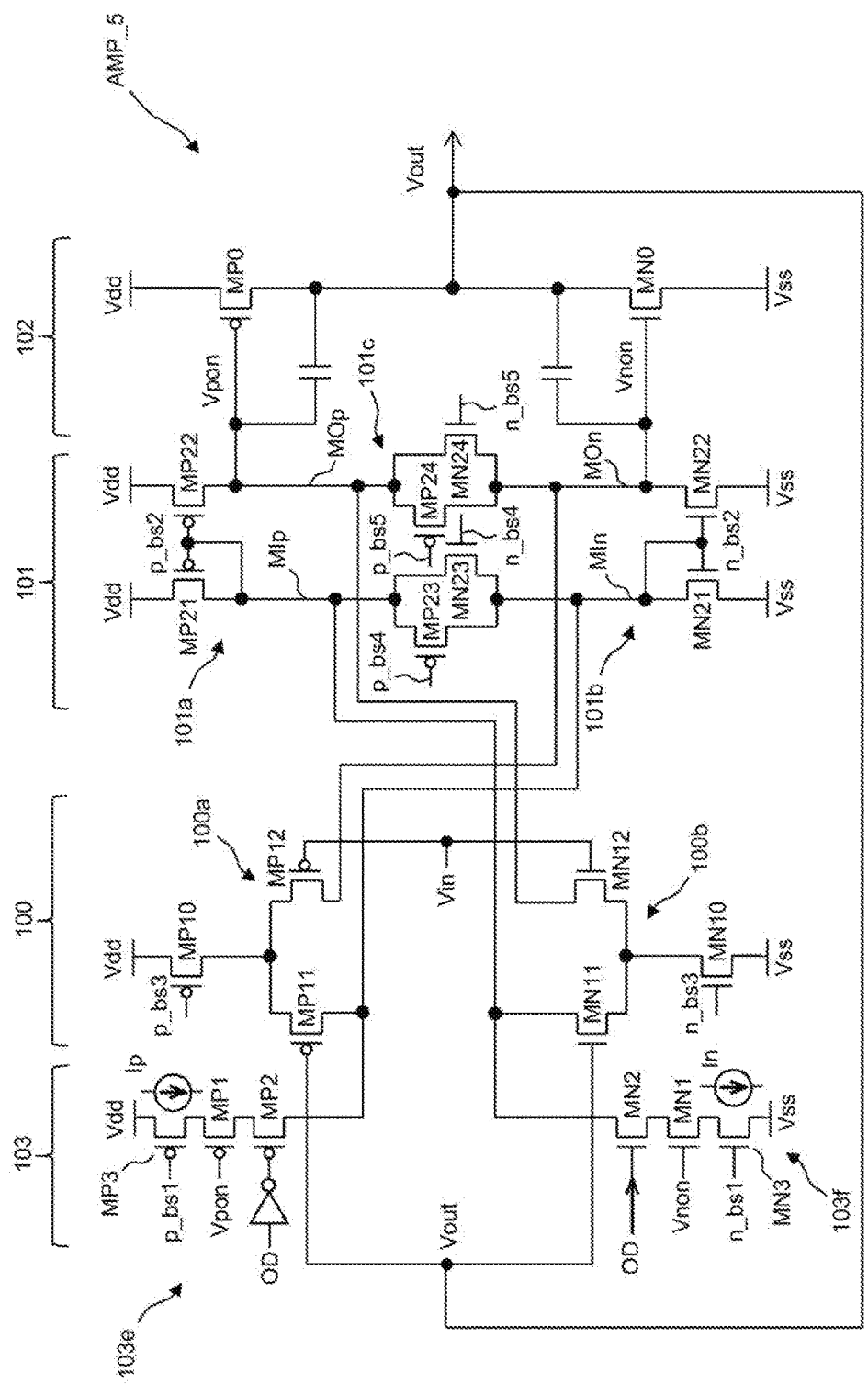
FIG. 7 is a circuit diagram showing an overdrive amplifier according to the fifth embodiment.
Figure 9:
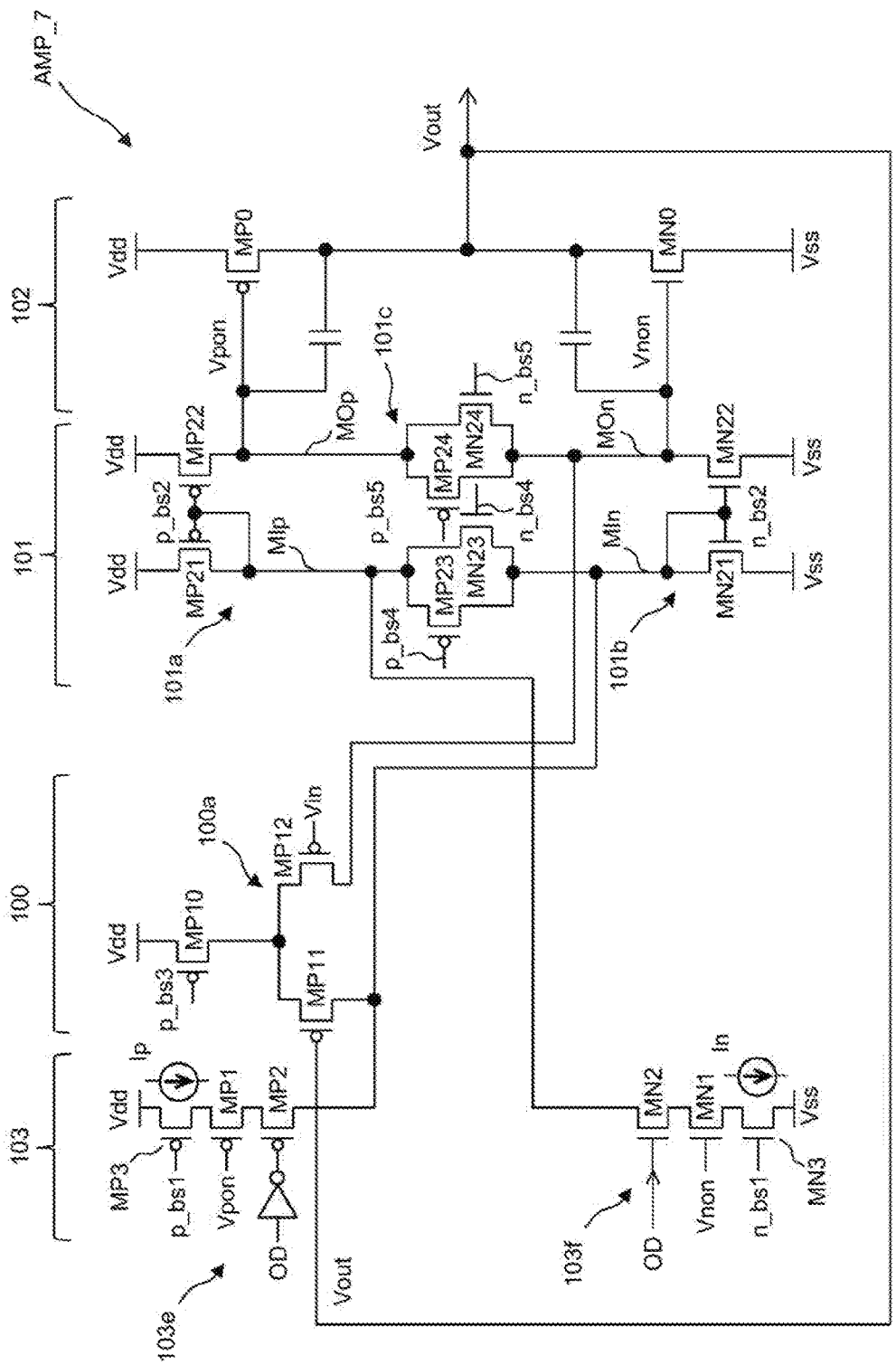
FIG. 9 is a circuit diagram showing an overdrive amplifier according to the seventh embodiment.
Figure 10:
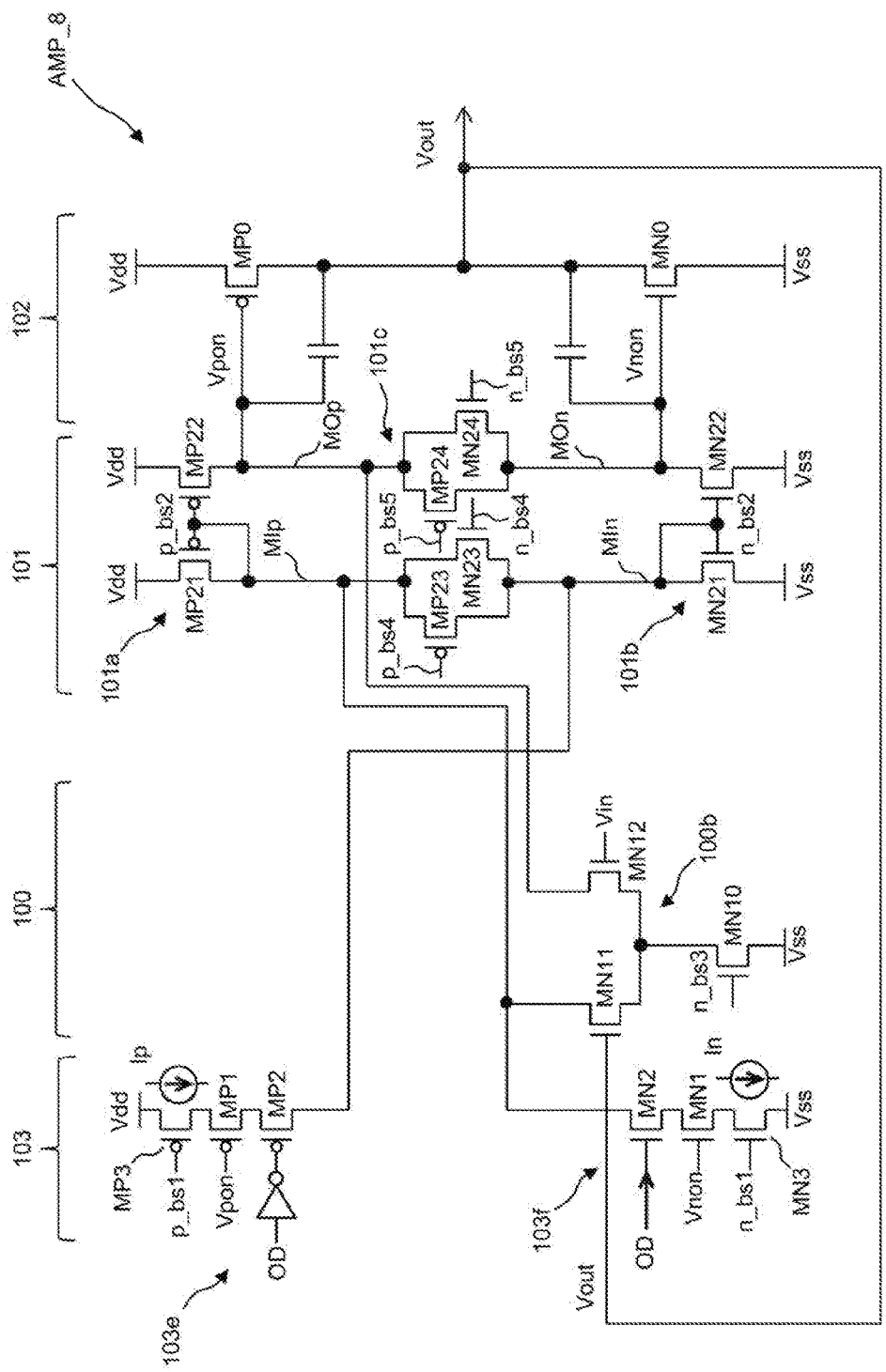
FIG. 10 is a circuit diagram showing an overdrive amplifier according to the eighth embodiment.

[12] Direct Control of Switch Transistors by Overdrive Control Signal (See FIGS. 7, 9 and 10)

In the overdrive amplifier as described in [11], the pMOS switch transistor (MP2) of the pMOS overdrive circuit (103e) accepts the input of an inverted signal of an overdrive control signal (OD) at its gate, and the nMOS switch transistor (MN2) of the nMOS overdrive circuit (103f) accepts the input of the overdrive control signal (OD) at its gate.

In one embodiment, the overdrive period can be controlled by the overdrive control signal.

Figure 8:
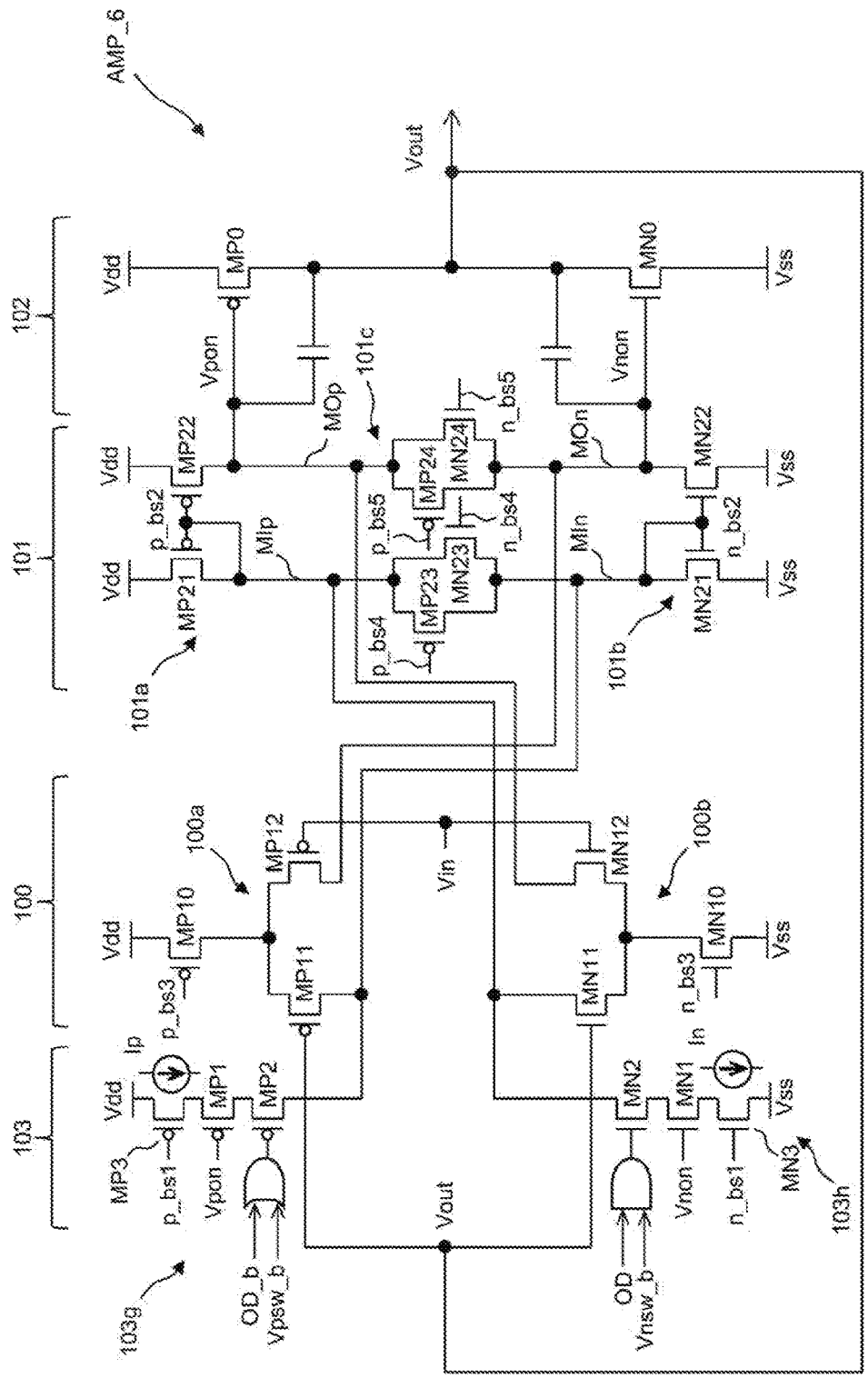
FIG. 8 is a circuit diagram showing an overdrive amplifier according to the sixth embodiment.

[13] Exclusive Control of the pMOS Switch Transistor and the nMOS Switch Transistor in Switching (See FIG. 8)

In the overdrive amplifier as described in [11], the pMOS switch transistor (MP2) of the pMOS overdrive circuit (103g) accepts the input of a logical OR signal of an inverted signal (OD_b) of an overdrive control signal and a first switch control signal (Vpsw_b) at its gate, and the nMOS switch transistor (MN2) of the nMOS overdrive circuit (103h) accepts the input of a logical AND signal of the overdrive control signal (OD) and a second switch control signal (Vnsw_b) at its gate. The first switch control signal is a signal synchronously changing earlier than a gate signal (Vpon) of the pMOS output transistor (MP0) composed of the p-channel type MOS transistor, and the second switch control signal is a signal synchronously changing earlier than a gate signal (Vnon) of the nMOS output transistor (MN0) composed of the n-channel type MOS transistor.

In one embodiment, the occurrence of such a malfunction that the direction of overdriving is reversed immediately after the start of overdriving can be prevented to avoid erroneous overdriving immediately after the start of overdriving as in the overdrive amplifier as described in [7].

[14] P-Channel Type Differential Input Transistor Pair and N-Channel Type Differential Input Transistor Pair (See FIGS. 7 and 8)

In the overdrive amplifier as described in [11], the differential input circuit includes a pMOS differential input transistor pair connected between the high-potential power source and the nMOS current mirror circuit, and an nMOS differential input transistor pair connected between the low-potential power source and the pMOS current mirror circuit as the differential input transistor pairs. The pMOS differential input transistor pair includes, as the input transistor and the feedback input transistor, a pMOS input transistor and a pMOS feedback input transistor composed of p-channel type MOS transistors respectively. The pMOS input transistor has a drain connected to the drain of the nMOS mirror output transistor, and the pMOS feedback input transistor has a drain connected to the drain of the nMOS mirror input transistor. The nMOS differential input transistor pair includes, as the input transistor and the feedback input transistor, an nMOS input transistor and an nMOS feedback input transistor composed of n-channel type MOS transistors respectively. The nMOS input transistor has a drain connected to the drain of the pMOS mirror output transistor, and the nMOS feedback input transistor has a drain connected to the drain of the pMOS mirror input transistor.

In one embodiment, a high responsiveness can be achieved concerning the negative feedback control of the output signal (Vout) corresponding to the input signal (Vin) as in the overdrive amplifier as described in [8].

[15] P-Channel Type Differential Input Transistor Pair (See FIG. 9)

In the overdrive amplifier as described in [11], the differential input transistor pair of the differential input circuit is a pMOS differential input transistor pair connected between the high-potential power source and the nMOS current mirror circuit. The pMOS differential input transistor pair includes, as the input transistor and the feedback input transistor, a pMOS input transistor and a pMOS feedback input transistor composed of p-channel type MOS transistors respectively. The pMOS input transistor has a drain connected to the drain of the nMOS mirror output transistor, and the pMOS feedback input transistor has a drain connected to the drain of the nMOS mirror input transistor.

This embodiment lowers the responsiveness of the negative feedback control from a low potential output to a high potential output somewhat in comparison to the overdrive amplifier as described in [14], but it can contribute to the reduction in circuit scale.

[16] N-Channel Type Differential Input Transistor Pair (See FIG. 10)

In the overdrive amplifier as described in [11], the differential input transistor pair of the differential input circuit is an nMOS differential input transistor pair connected between the low-potential power source and the pMOS current mirror circuit. The nMOS differential input transistor pair includes, as the input transistor and the feedback input transistor, an nMOS input transistor and an nMOS feedback input transistor composed of n-channel type MOS transistors respectively. The nMOS input transistor has a drain connected to the drain of the pMOS mirror output transistor, and the nMOS feedback input transistor has a drain connected to the drain of the pMOS mirror input transistor.

This embodiment can lower the responsiveness of the negative feedback control from a high potential output to a low potential output in comparison to the overdrive amplifier as described in [14], but it can contribute to the reduction in circuit scale.

Figure 14:
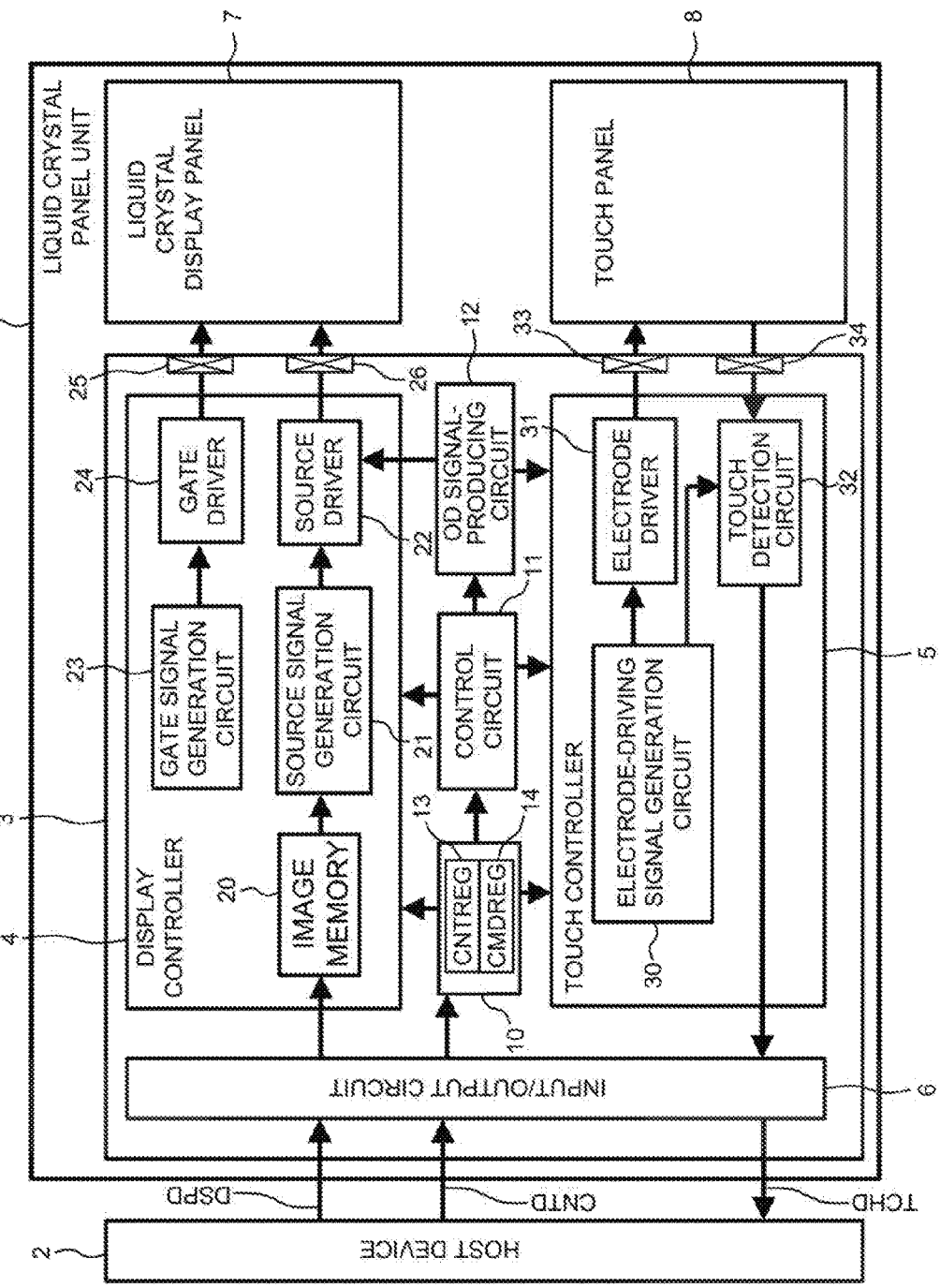
FIG. 14 is a block diagram showing, by example, an LCD drive IC in application of the overdrive amplifier to a source line driver.

[17] Semiconductor Device (See FIG. 14)

A semiconductor device (3) is formed on a semiconductor substrate, and includes a plurality of overdrive amplifiers (AMP_1 to AMP_8) which are operated in parallel. The overdrive amplifiers each have: a differential input circuit (100) having differential input transistor pairs arranged by connecting, in a folded-cascode style, input transistors (MP12, MN12) supplied with an input signal (Vin) at gates and feedback input transistors (MP11, MN11) accepting the feedback of an output signal (Vout) at gates; a current mirror load (101) having mirror input current paths (MIp, MIn) connected to current paths of the feedback input transistors, and mirror output current paths (MOp, MOn) connected to current paths of the input transistors; an output circuit (102) accepting the input of output control signals (Vpon, Vnon) from the mirror output current paths of the current mirror load; and an overdrive circuit (103) which causes bias currents (Ip, In) of directions which boost an output of the output circuit, depending on the output control signals, to pass through the current mirror load based on the output control signals in an overdrive period.

In one embodiment, the overdrive amplifier per se can autonomously boost an output of the output circuit to output by the output control signals in an overdrive period as the overdrive amplifier described in [1] does. Therefore, by adding a small-scale circuit, both the low current consumption and the high-speed driving can be achieved. The semiconductor device as described above is suitable for such a use that it is incorporated in e.g. a battery-driven portable device where low power consumption is desired when driving a display. Further, the overdrive amplifier per se autonomously boosts an output of the output circuit to output by the output control signals and as such, even if the overdrive amplifiers operated in parallel vary in output level, the appropriate overdriving is performed according to the difference in output level autonomously.

[18] Supply of Bias Currents to Mirror Input Current Paths of the Current Mirror Load (See FIGS. 1, 3-5 and 7-10)

In the semiconductor device as described in [17], the output circuit has output transistors receiving the output control signals at gates. The overdrive circuit has overdrive transistors controlled in mutual conductance based on the output control signals, and switch transistors connected in series with the overdrive transistors respectively, which are turned on in the overdrive period; and the overdrive circuit causes each bias current to pass through the mirror input current path of the current mirror load with the corresponding switch transistor in ON state.

This embodiment brings about the same effect and advantage as those achieved by the overdrive amplifier as described in [2].

[19] Control of Bias Transistor's Mutual Conductance by a Value Set on a Register The semiconductor device as described in [18] further has a control register (13). In the semiconductor device, the overdrive circuit further includes bias transistors connected in series with the overdrive transistors respectively; the bias transistors have mutual conductances determined according to voltages of respective bias signals (p_bs1, n_bs1) supplied at their gates; and control data determining the voltages of the bias signals are overwritably set in the control register.

In one embodiment, the overdriving power of each overdrive amplifier, i.e. the degree of boosting an output of the output circuit by regulating the amount of each bias current can be variably set by control data to be written into the control register according to a load to be driven.

[20] LCD Drive IC with a Source Driver to which Overdrive Amplifiers are Applied The semiconductor device as described in [19] further includes a source driver operable to output gradation voltage signals according to display data in parallel in synchronization with a display timing; the source driver has the plurality of overdrive amplifiers; and each overdrive amplifier is a buffer amplifier operable to output the gradation voltage signal from a corresponding external terminal to outside the semiconductor device.

In one embodiment, the difference in convergence time between near and far ends of a source line load of a liquid crystal display panel mounted on a tablet, a smartphone or the like can be minimized. In addition, a source driver is allowed to perform an overdrive action without largely changing the circuit, and the regulation of the drive voltage level is enabled. This embodiment is suitable for materializing the pixel driving which is low in power consumption, higher in speed and superior in responsiveness without increasing the circuit scale in a liquid crystal display panel mounted on a tablet, a smartphone or the like, and advanced toward a higher definition.

Non-limiting effects achieved by the representative embodiment of the embodiments herein disclosed will be briefly described below.

The amount of overdriving can be self-regulated according to a drivable voltage width. Further, the excess overdriving can be suppressed readily. An overdrive amplifier which can be used for e.g. minimizing the difference in convergence time between near and far ends of a load, and low current consumption and high-speed driving can be realized just by adding a small-scale circuit.

Description

Various kinds of overdrive amplifiers will be described as examples below, which are denoted by AMP_1 to AMP_8. The overdrive amplifiers AMP_1 to AMP_8 each include a differential input circuit 100, a current mirror load 101, an output circuit 102, and an overdrive circuit 103, and constitute a buffer amplifier such as a voltage follower amplifier. The overdrive circuit 103 is materialized by a bias current circuit for causing a bias current to flow in an overdrive period.

Now, the overdrive amplifier AMP_1 according to the first embodiment will be described with reference to FIG. 1.

Although no special restriction is intended, in the overdrive amplifier ASMP_1, the current mirror load 100 includes: a pMOS current mirror circuit 101a connected between a floating current source 101c and a high-potential power source Vdd (e.g. a positive power source of +15V); and an nMOS current mirror circuit 101b connected between the floating current source 101c and a low-potential power source Vss (e.g. a negative power source of −15V). The pMOS current mirror circuit 101a has a pMOS mirror input transistor MP21 and a pMOS mirror output transistor MP22 which are composed of p-channel type MOS transistors respectively, and of which the gates are commonly connected together; the gate and drain of the pMOS mirror input transistor MP21 are connected to each other. The nMOS current mirror circuit 101b has an nMOS mirror input transistor MN21 and an nMOS mirror output transistor MN22 which are composed of n-channel type MOS transistors respectively and of which the gate are commonly connected together; the gate and drain of the nMOS mirror input transistor MN21 are connected to each other. The floating current source 101c includes: a pMOS transistor MP23 and an nMOS transistor MN23, which are connected in series between the drain of the pMOS mirror input transistor MP21 and the drain of the nMOS mirror input transistor MN21; and a pMOS transistor MP24 and an nMOS transistor MN24, which are connected in series between the drain of the pMOS mirror output transistor MP22 and the drain of the nMOS mirror output transistor MN22. In the floating current source 101c, a bias voltage p_bs4 is supplied to the gate of the pMOS transistor MP23; a bias voltage n_bs4 is supplied to the gate of the nMOS transistor MN23; a bias voltage p_bs5 is supplied to the gate of the pMOS transistor MP24; and a bias voltage n_bs5 is supplied to the gate of the nMOS transistor MN24. The floating current source functions as a floating current source having an on-resistance depending on respective gate-source voltages.

Although no special restriction is intended, as shown in FIG. 1, the output circuit 102 is configured as a push-pull output circuit having a pMOS output transistor MP0 and an nMOS output transistor MN0 connected in series. The pMOS output transistor MP0 is composed of a p-channel type MOS transistor of which the gate is connected to the drain of the pMOS mirror output transistor MP22 of the pMOS current mirror circuit 101a. The nMOS output transistor MN0 is composed of an n-channel type MOS transistor of which the gate is connected to the drain of the nMOS mirror output transistor MN22 of the nMOS current mirror circuit 101b. A gate input signal to the pMOS output transistor MP0 is an output control signal Vpon, and a gate input signal to the nMOS output transistor MN0 is an output control signal Vnon.

Although no special restriction is intended, as shown in FIG. 1, the differential input circuit 100 includes a pMOS differential input transistor pair 100a and an nMOS differential input transistor pair 100b. The pMOS differential input transistor pair 100a is connected between the high-potential power source Vdd and the nMOS current mirror circuit 101b through a constant current source MOS transistor MP10 of a p-channel type, whereas the nMOS differential input transistor pair 100b is connected between the low-potential power source Vss and the pMOS current mirror circuit 101a through a constant current source MOS transistor MN10 of an n-channel type. In the differential input circuit, a bias voltage p_bs3 is applied to the gate of the constant current source MOS transistor MP10, whereas a bias voltage n_bs3 is applied to the gate of the constant current source MOS transistor MN10.

The pMOS differential input transistor pair 100a includes a pMOS input transistor MP12 and a pMOS feedback input transistor MP11 which are composed of p-channel type MOS transistors respectively, in which the drain of the pMOS input transistor MP12 is connected with the drain of the nMOS mirror output transistor MN22, and the drain of the pMOS feedback input transistor MP11 is connected with the drain of the nMOS mirror input transistor MN21.

The nMOS differential input transistor pair 100b includes an nMOS input transistor MN12 and an nMOS feedback input transistor MN11 which are composed of n-channel type MOS transistors respectively, in which the drain of the nMOS input transistor MN12 is connected with the drain of the pMOS mirror output transistor MP22, and the drain of the nMOS feedback input transistor MN11 is connected with the drain of the pMOS mirror input transistor MP21.

The overdrive circuit 103 causes bias currents Ip and In of directions, which boost an output of the output circuit 102 according to the output control signals Vpon and Vnon, to pass through the current mirror load 101 based on the output control signals Vpon and Vnon in an overdrive period. In the embodiment of FIG. 1, the overdrive circuit 103 has: a pMOS overdrive circuit 103a connected between the drain of the pMOS mirror input transistor MP21 included in the pMOS current mirror circuit 101a, and the high-potential power source Vdd; and an nMOS overdrive circuit 103b connected between the drain of the nMOS mirror input transistor MN21 included in the nMOS current mirror circuit 101b, and the low-potential power source Vss.

The pMOS overdrive circuit has a series circuit of an overdrive transistor MP1, a switch transistor MP2 and a bias transistor MP3 which are composed of p-channel type MOS transistors respectively. The overdrive transistor MP1 is controlled by the control signal Vpon in mutual conductance. The switch transistor MP2 receives the inverted signal of an overdrive control signal OD at its gate, and is controlled to stay in ON state in an overdrive period. The bias transistor MP3 is controlled in its mutual conductance according to the voltage of a bias signal p_bs1 supplied to its gate.

The nMOS overdrive circuit has a series circuit of an nMOS overdrive transistor MN1, an nMOS switch transistor MN2 and an nMOS bias transistor MN3 which are composed of n-channel type MOS transistors respectively. The overdrive transistor MN1 is controlled by the control signal Vnon in mutual conductance. The switch transistor MN2 receives the overdrive control signal OD at its gate, and is controlled to stay in ON state in an overdrive period. The bias transistor MN3 is controlled in its mutual conductance according to the voltage of a bias signal n_bs1 supplied to its gate.

In the overdrive amplifier AMP_1 of FIG. 1, the differential input circuit 100, the current mirror load 101 and the output circuit 102 have the function of controlling the negative feedback of an output signal Vout corresponding to an input signal Vin. Specifically, the output signal Vout is changed toward a higher voltage direction when Vin>Vout, whereas the output signal Vout is changed toward a lower voltage direction when Vi<Vout. On the premise of having the negative feedback control function, the overdrive circuit 103 is arranged to cause the bias currents Ip and In of directions, which boost the output of the output circuit 102 according to the output control signals Vpon and Vnon, to pass through the current mirror circuits 101a and 101b in an overdrive period.

More specifically, when Vin>Vout is satisfied in driving, the current flowing through an output current path MOp of the pMOS current mirror circuit 101a is increased, and the current passing through an input current path MIn of the nMOS current mirror circuit 101b is increased. As a result, the level of the output control signal Vpon lowers and the mutual conductance of the output MOS transistor MP0 is made larger; and the level of the output control signal Vnon lowers, whereby the mutual conductance of the output MOS transistor MN0 is reduced and the output signal Vout is changed toward a higher voltage direction. In that time the output control signals Vpon and Vnon are also supplied to the gates of the overdrive transistors MP1 and MN1. So, the pMOS overdrive transistor MP1 is turned on, and the nMOS overdrive transistor MN1 is turned off. In an overdrive period in which the overdrive control signal OD remains at High level, the pMOS overdrive circuit 103a supplies the bias current Ip to the mirror input current path MIp of the pMOS current mirror circuit 101a, and the nMOS current mirror circuit 103b does not cause the bias current In to flow. By supplying the bias current Ip, the level of the output control signal Vpon is lowered accordingly and thus, the output signal Vout produces a rise in offset voltage ΔVos (Vout=Vin+ΔVos). The switch transistors MP2 and MN2 are both put in OFF state out of an overdrive period. Therefore, the bias currents Ip and In are not caused to flow, and the convergence voltage of the output signal Vout becomes the input voltage Vin.

On the other hand, when Vout>Vin is satisfied in driving, the current flowing through the output current path MOn of the nMOS current mirror circuit 101b is increased, and the current flowing through the input current path MIp of the pMOS current mirror circuit 101a is increased. As a result the level of the output control signal Vnon rises, and the mutual conductance of the output MOS transistor MN0 is made larger; and the level of the output control signal Vpon rises, whereby the mutual conductance of the output MOS transistor MP0 is reduced and the output signal Vout is changed toward a lower voltage direction. In that time the output control signals Vpon and Vnon are also supplied to the gates of the overdrive transistors MP1 and MN1. So the pMOS overdrive transistor MP1 is turned off, and the nMOS overdrive transistor MN1 is turned on. In an overdrive period in which the overdrive control signal OD remains at High level, the nMOS overdrive circuit 103b draws out the bias current In from the mirror input current path MIn of the nMOS current mirror circuit 101b, whereas the pMOS current mirror circuit 103a prevents the bias current Ip from flowing. By drawing out the bias current In, the level of the output control signal Vnon is raised accordingly and thus, the output signal Vout produces a drop in offset voltage ΔVos (Vout=Vin−ΔVos). The switch transistors MP2 and MN2 are both put in OFF state out of an overdrive period. Therefore, the bias currents Ip and In are not caused to flow, and the convergence voltage of the output signal Vout becomes the input voltage Vin.

Figure 2:
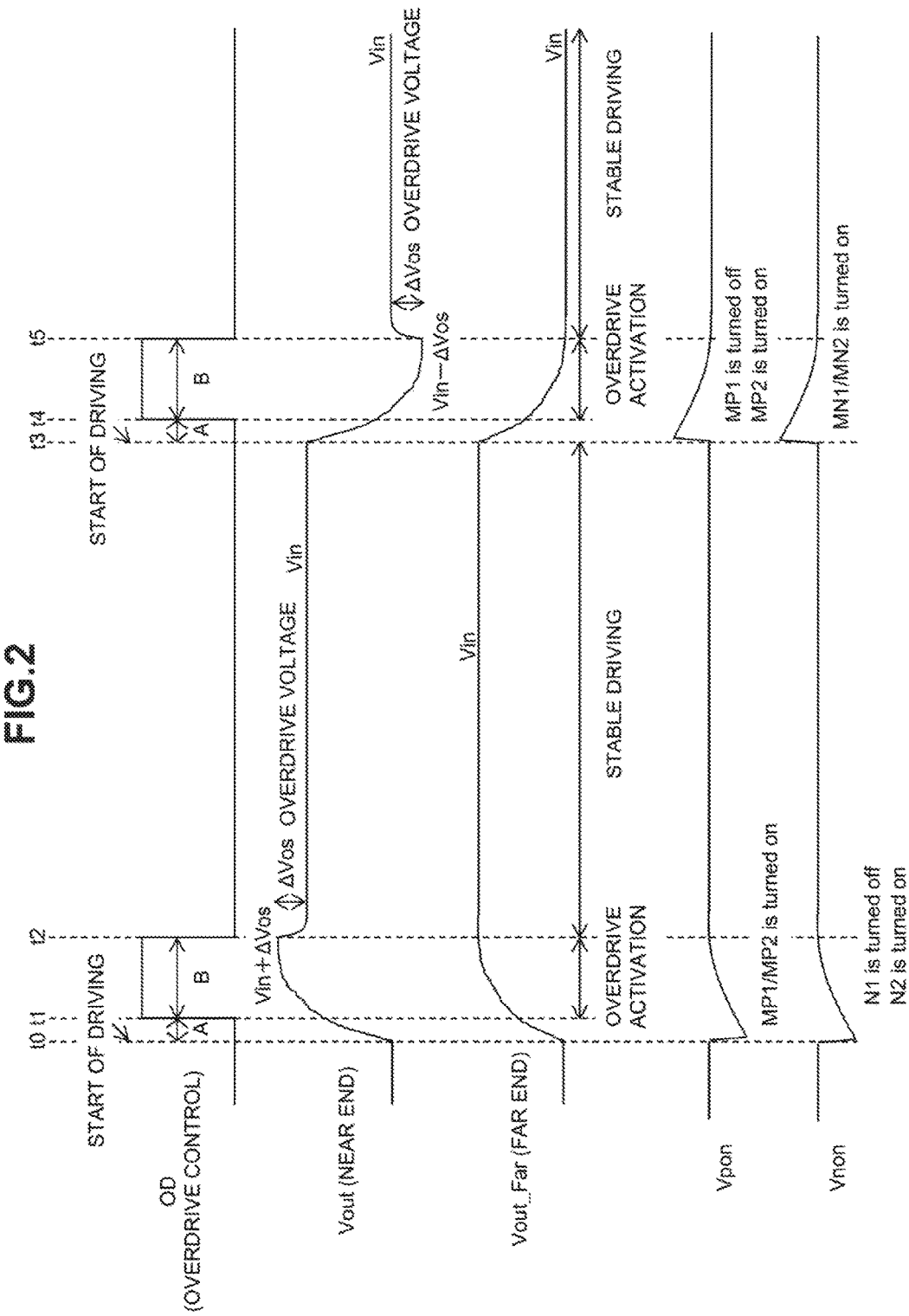
FIG. 2 is a waveform diagram showing, by example, action waveforms of the overdrive amplifier.
Figure 11:
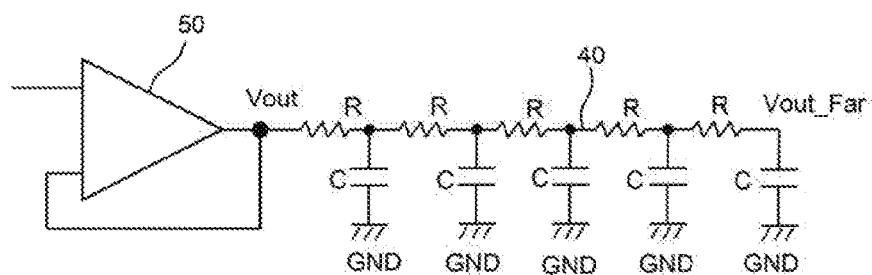
FIG. 11 is a diagram for explaining a source line load of a liquid crystal display panel.
Figure 12:
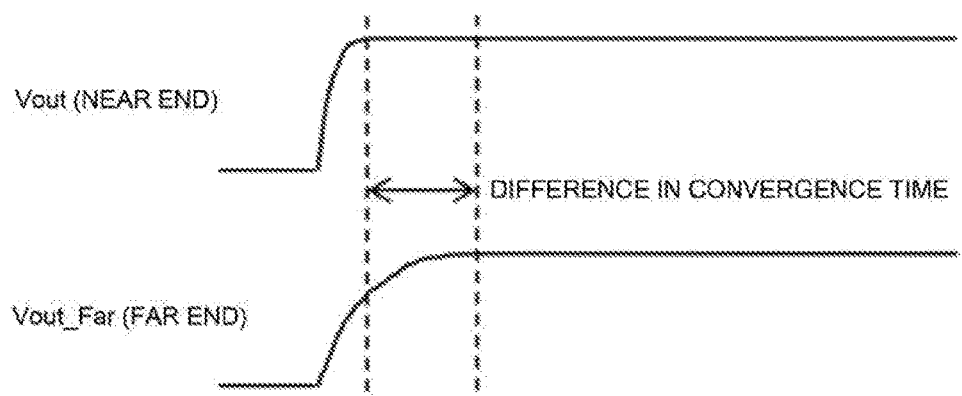
FIG. 12 is a waveform diagram showing, by example, load driving waveforms at near and far ends of a source line.

For instance, it is envisioned here to drive a load 40 in application of the overdrive amplifier AMP_1 to the buffer amplifier 50 of FIG. 11. Supposing the load 40 to be an elongated load, e.g. a source line with many liquid crystal display elements connected thereto in order, "R" represents, as a distributed resistance, a resistance component which is parasitic on the load 40, and "C" represents, as a distributed capacitance, a capacitance component which is parasitic on or connected to the load 40. FIG. 2 shows, by example, driving waveforms when driving the load 40 from one end in the overdrive amplifier AMP_1. The driving waveforms of the load 40 exemplified in FIG. 2 are of two cycles, i.e. the cycle starting from the time t0, and the cycle starting from the time t3. The input signal Vin is changed from a low potential to a high potential at the time t0. Then, following the change, the activation of the load toward a higher potential side is started by the output signal Vout of the overdrive amplifier AMP_1. At the time t1 after elapse of a time A, the overdrive control signal OD is turned to High level to cause the bias current Ip to flow; the output control signals Vpon and Vnon both lower in level; and a voltage given by the input signal Vin plus the offset voltage Vos is output as the output signal Vout. Consequently, the near end load 40 of the overdrive amplifier AMP_1 is driven to the voltage of the input signal Vin+Vos; and the far end load 40 to which the drive voltage thus boosted is transmitted is activated to the input voltage Vin without being largely delayed. At and after the time t2 when an overdrive period of a time B is terminated, the near and far ends of the load are both converged to the level of the input signal Vin. At the time t3, the input signal Vin inverted in polarity is changed from the high potential to the low potential. Then, following the change, the activation of the load toward a lower potential side is started by the output signal Vout of the overdrive amplifier AMP_1. At the time t4, the overdriving is started, and the overdrive control signal OD is turned to High level to cause the bias current In to flow; the output control signals Vpon and Vnon both rise in level; and a voltage obtained by subtracting the offset voltage Vos from the input signal Vin is output as the output signal Vout. Consequently, the near end load 40 of the overdrive amplifier AMP_1 is driven toward the voltage of the input signal Vin–Vos; the far end load 40 to which the drive voltage thus boosted is transmitted is activated toward the input voltage Vin without being largely delayed. At and after the time t5 when an overdrive period of the time B is terminated, the near and far ends of the load are both converged to the level of the input signal Vin. Not using the overdriving function, as exemplified in FIG. 12, it takes more time for the driving waveform to converge to the input signal Vin at the far end of the load and thus, the responsiveness in driving the load is worsened. Therefore, as is clear from FIG. 2, a driving time for the far end of the load 40 to converge to a targeted end-point voltage can be shortened with the aid of the overdriving function arranged to cause the bias currents Ip and In to flow.

Particularly, the bias currents Ip and In are controlled based on the output control signals Vpon and Vnon in amount. In fact, the overdrive amplifier AMP_1 per se autonomously boosts an output which the output circuit 102 sends out according to the output control signals Vpon and Vnon in an overdrive period. In other words, the overdrive amplifier can self-regulates the amount of overdriving according to an overdrivable voltage width. That is, it can autonomously perform an appropriate overdriving. On this account, it is not required to largely increase the circuit scale or the circuit action as in the case of correcting, by a digital operation, drive data for overdriving. Therefore, an overdrive to be used for minimizing the difference in convergence time between near and far ends of a load, easing the influence of the response characteristic of the load varied according to a temperature environment, and other purposes can be materialized by just adding a small-scale circuit to a drive amplifier, which provide low current consumption and high-speed driving.

In addition, the overdrive period can be regulated by an ON action period according to the switch control on the switch transistors MP2 and MN2, and the overdrive period can be controlled by the overdrive control signal OD.

Further, the mutual conductances of the bias transistors MP3 and MN3 can be determined by bias signals p_bs1 and n_bs1. Therefore, the bias currents Ip and In which the overdrive circuit 103 outputs can be variably controlled in amount, and the output boosting (overdrive voltage) of the output circuit can be regulated by regulating the bias current amounts.

Since the current mirror circuit 101 is arranged to include the pMOS current mirror circuit 101a, the floating current source 101c and the nMOS current mirror circuit 101b, an output waveform of the output circuit, directed from the low-potential power source toward the high-potential power source, and an output waveform of the output circuit, directed from the high-potential power source toward the low-potential power source which are symmetrical to each other can be achieved readily.

The state of the nMOS current mirror circuit 101b is determined according to an input to the pMOS differential input transistor pair 100a, and the state of the pMOS current mirror circuit 101a is determined according to an input to the nMOS differential input transistor pair 100b. Therefore, a high responsiveness can be achieved in feedback control of the output signal Vout to the input signal Vin.

The overdrive amplifier AMP_2 of FIG. 3 and the overdrive amplifier AMP_3 of FIG. 4 will be described as modifications of the overdrive amplifier AMP_1 of FIG. 1.

The overdrive amplifier AMP_2 of FIG. 3 is different from that of FIG. 1 in that the differential input circuit 100 includes only an nMOS differential input transistor pair 100b. Unlike the overdrive amplifier of FIG. 1, the overdrive amplifier AMP_2 can contribute to the reduction in circuit scale while suffering some decline in responsiveness of negative feedback control in changing from a high potential output to a low potential output. The other parts are the same as those in FIG. 1, so their detailed descriptions are skipped here. The overdrive amplifier of FIG. 3 is particularly suitable for such a case that the range of the input voltage Vin is not a full range of Vss to Vdd.

The overdrive amplifier AMP_3 of FIG. 4 is different from that of FIG. 1 in that the differential input circuit 100 includes only a pMOS differential input transistor pair 100a. Unlike the overdrive amplifier of FIG. 1, the overdrive amplifier AMP_3 can contribute the reduction in circuit scale while suffering some decline in the responsiveness in negative feedback control in changing from a low potential output to a high potential output. The other parts are the same as those in FIG. 1, so their detailed descriptions are skipped here. The overdrive amplifier of FIG. 4 is particularly suitable for such a case that the range of the input voltage Vin is not the full range of Vss to Vdd.

The overdrive amplifier AMP_4 of FIG. 5 will be described as another modification of the overdrive amplifier AMP_1 of FIG. 1.

The overdrive amplifier AMP_4 of FIG. 5 is different from that of FIG. 1 in that switch states of the pMOS switch transistors MP2 and the nMOS switch transistor MN2 are controlled exclusively. Specifically, the pMOS switch transistor MP2 of the pMOS overdrive circuit 103c accepts the input of a logical OR signal of an inverted signal OD_b of an overdrive control signal OD, and a first switch control signal Vpsw_b at its gate. The nMOS switch transistor MN2 of the nMOS overdrive circuit 103d accepts the input of a logical AND signal of the overdrive control signal OD and a second switch control signal Vnsw_b at its gate. The first switch control signal Vpsw_b is a signal which is changed to Low level later than the gate signal Vpon of the pMOS output transistor MP0, and changed to High level earlier than that. The second switch control signal Vnsw_b is a signal which is changed to Low level earlier than the gate signal Vnon of the nMOS output transistor MN0, and changed to High level later than that. That is, the first switch control signal Vpsw_b turns off the pMOS switch transistor MP2 earlier than the change in the output control signal Vpon, and turns on the pMOS switch transistor later than the change. The second switch control signal Vnsw_b turns off the nMOS switch transistor MN2 earlier than the change in the output control signal Vnon, and turns on the nMOS switch transistor later than the change.

The first switch control signal Vpsw_b is produced by the comparator 103c shown by example in FIG. 6. The second switch control signal Vnsw_b is produced by the comparator 103d shown by example in FIG. 6. The comparator 103c inverts an output Vpsw of a push-pull circuit arranged by connecting, in series, a p-channel type pMOS transistor MP32 receiving the output control signal Vpon at its gate and an n-channel type nMOS transistor MN32 receiving the output control signal Vnon at its gate, thereby producing the first switch control signal Vpsw_b. Supposing that the transistor size of the pMOS transistor MP32 is Wp/Lp, the transistor size of the nMOS transistor MN32 becomes (Wn+α)/Ln, and the gate width of the nMOS transistor MN32 is made larger than the gate width of the pMOS transistor MP32 by the size α. Therefore, the nMOS transistor MN32 is turned on earlier than the output MOS transistor MN0, and turned off later than the output MOS transistor. In other words, the first switch control signal Vpsw_b turns off the pMOS switch transistor MP2 earlier than the change in the output control signal Vpon, and turns on the pMOS switch transistor later than the change.

The comparator 103d inverts an output Vnsw of a push-pull circuit arranged by connecting, in series, a p-channel type pMOS transistor MP31 receiving the output control signal Vpon at its gate and an n-channel type nMOS transistor MN31 receiving the output control signal Vnon at its gate, thereby producing the second switch control signal Vnsw_b. Supposing that the transistor size of the nMOS transistor MN31 is Wn/Ln, the transistor size of the pMOS transistor MP31 becomes (Wp+α)/Lp, and the gate width of the pMOS transistor MP31 is made larger than the gate width of the nMOS transistor MN31 by the size α. Therefore, the pMOS transistor MP31 is turned on earlier than the output MOS transistor MP0, and turned off later than the output MOS transistor. In other words, the second switch control signal Vnsw_b turns off the nMOS switch transistor MN2 earlier than the change in the output control signal Vnon, and turns on the nMOS switch transistor later than the change.

The switch transistors MP2 and MN2 are both turned on after start of overdriving in the case of directly controlling the switch transistors MP2 and MN2 by the overdrive control signal OD as in the overdrive amplifier of FIG. 1. So, depending on the voltages of the output control signals Vpon and Vnon, the overdrive transistors MP1 and MN1 can be both turned on to cause the bias currents Ip and In to flow even in any of the cases of Vin>Vout and Vin<Vout. As an originally intended output-boosting function, it is efficient to cause only the bias current Ip to flow under the condition of Vin>Vout after start of overdriving, and to cause only the bias current In to flow under the condition of Vin<Vout. Therefore, arranging the overdrive amplifier to turn on only the pMOS switch transistor MP2 under the condition of Vin>Vout, and turn on only the nMOS switch transistor MN2 under the condition of Vin<Vout, as shown in FIG. 5, any one of the bias currents Ip and In can be caused to flow. Particularly, in the overdrive amplifier arranged so, the first switch control signal Vpsw_b, which is changed to Low level later than the change in the gate signal Vpon of the pMOS output transistor MP0, is used to start passing the bias current Ip through the pMOS overdrive circuit 103c, and the second switch control signal Vnsw_b, which is changed to High level later than the change in the gate signal Vnon of the nMOS output transistor MN0, is used to start passing the bias current In through the nMOS overdrive circuit 103d. Thus, the occurrence of such a malfunction that the direction of overdriving is reversed immediately after start of the overdriving, i.e. a situation in which the bias current In is caused to flow when to pass the bias current Ip or reversely, the bias current Ip is caused to flow when to pass the bias current In can be prevented. In fact, it is possible to avoid erroneous overdriving immediately after start of overdriving.

The other parts are the same as those in FIG. 1 and therefore, their detailed descriptions are skipped here.

The overdrive amplifier AMP_5 of FIG. 7 will be described as a modification of the overdrive amplifier AMP_1 of FIG. 1.

The overdrive amplifier AMP_5 of FIG. 7 is different from that of FIG. 1 in that the overdrive circuit 103 is disposed on the side of feedback MOS transistors MP11 and MN11 of the differential input circuit 100, and the nMOS overdrive circuit 103f is coupled to the pMOS current mirror circuit 101a, and the pMOS overdrive circuit 103e is coupled to the nMOS current mirror circuit 101b. That is, the structure in which the nMOS overdrive circuit 103f is connected between the drain of the pMOS mirror input transistor MP21 included in the pMOS current mirror circuit 101a and the low-potential power source Vss, and the pMOS overdrive circuit 103e is connected between the drain of the nMOS mirror input transistor MN21 included in the nMOS current mirror circuit 101b and the high-potential power source Vdd is adopted.

The pMOS overdrive circuit 103e has a pMOS overdrive transistor MP1, a pMOS switch transistor MP2 and a pMOS bias transistor MP3. The nMOS overdrive circuit 103f has an nMOS overdrive transistor MN1, an nMOS switch transistor MN2 and an nMOS bias transistor MN3.

In one embodiment, the pMOS overdrive circuit 103e supplies current to the mirror current input path MIn of the nMOS current mirror circuit 101b thereby to act so as to lower the drain voltage of the mirror current output path MOn by supplying, and reduces the mutual conductance of the nMOS output transistor MN0, thereby to autonomously boost an output of High level which the output circuit 102 is to output toward a higher potential side. Further, the nMOS overdrive circuit 103f causes current to flow in of a direction in which the current is drawn from the mirror current input path MIp of the pMOS current mirror circuit 101a thereby to act so as to raise the drain voltage of the mirror current output path MOp, and decreases the mutual conductance of the pMOS output transistor MP0 thereby to autonomously boost an output of Low level which the output circuit 102 is to output toward a lower potential side.

The other parts are the same as those in FIG. 1 and therefore, their detailed descriptions are skipped here.

The overdrive amplifier AMP_6 of FIG. 8 is a modification of the overdrive amplifier AMP_4 of FIG. 5; the overdrive amplifier AMP_7 of FIG. 9 is a modification of the overdrive amplifier AMP_3 of FIG. 4; and the overdrive amplifier AMP_8 of FIG. 10 is a modification of the overdrive amplifier AMP_2 of FIG. 3. The modifications are different from the overdrive amplifier of FIG. 1 just in that the overdrive circuit 103 is arranged on the side of feedback MOS transistors MP11 and MN11 of the differential input circuit 100 as in the overdrive amplifier AMP_5 of FIG. 7, which is arranged by modifying the overdrive amplifier AMP_1 of FIG. 1.

Overdrive circuits 103g and 103h are adopted for the overdrive amplifier AMP_6 of FIG. 8. The overdrive circuits 103g and 103h have like constituent parts as in the overdrive circuits 103c and 103d of FIG. 5, which are identified by the same reference character strings, and of which the detailed descriptions are omitted. Also, the other parts are the same as those in FIG. 1 and therefore, their detailed descriptions are skipped here.

FIG. 14 shows, by example, a system embedded with an LCD drive IC 3 to which the overdrive amplifier as described above is applied. The reference numeral "1" denotes a liquid crystal panel unit, and "2" denotes a host device. The liquid crystal panel unit 1 has a liquid crystal display panel 7, a touch panel 8 disposed thereon and the LCD drive IC 3 which is an example of a semiconductor device according to the invention. Although no special restriction is intended, the LCD drive IC 3 is formed on a semiconductor substrate (chip) of single crystal silicon or the like by a known CMOS IC manufacturing technique.

The host device 2 provides the LCD drive IC 3 with display data, a display control command, a touch control command and others, and acquires touch detection data, a status, etc. from the LCD drive IC 3. In an application to e.g. a portable terminal device, the host device 2 includes a communication part accessible to a portable communication network and the like, a protocol processor operable to perform a communication protocol processing with a communication part, an application processor operable to control the protocol processor and various kinds of data processing, and peripheral devices, such as an auxiliary storage and an external interface circuit. The host device 2 is not limited to the above embodiment. It may be one of various kinds of electronic devices each using the liquid crystal panel unit 1.

Figure 13:
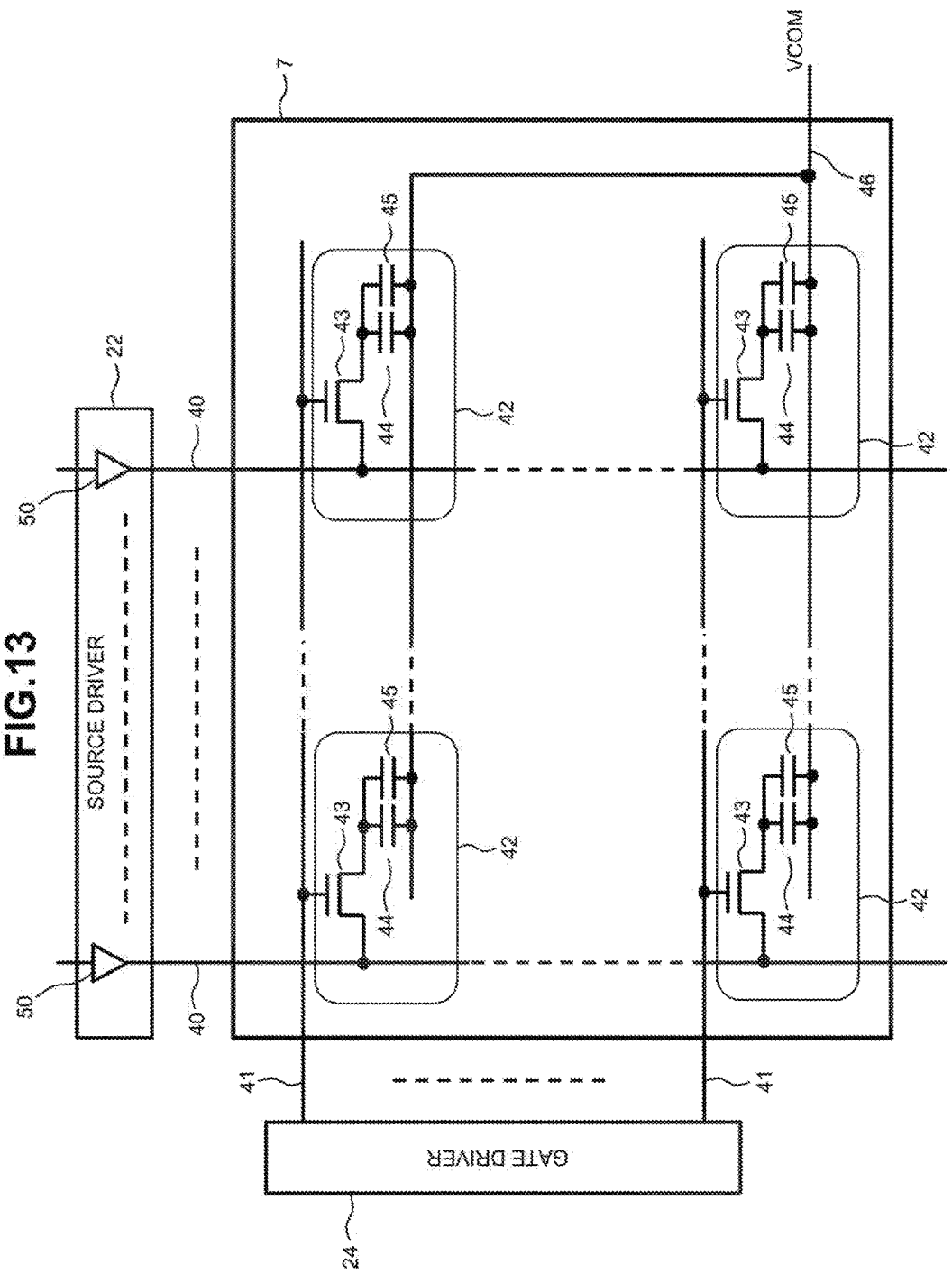
FIG. 13 is a circuit diagram showing a liquid crystal display panel according to an embodiment.

As illustrated in FIG. 13, the liquid crystal display panel 7 has display elements 42 formed on a glass substrate like a matrix; the display elements 42 each have a data terminal and a common terminal. The display elements 42 each have a thin film transistor 43, and a liquid crystal 44 between liquid crystal electrodes and a capacitance 45 which are connected in series with the thin film transistor. The data terminal is coupled to the source of the thin film transistor 43, and the common terminal is coupled to one of the liquid crystal electrodes. Each display element 42 has a select terminal coupled to the gate of the thin film transistor 43. The display element 42 is provided with a common voltage VCOM as a common potential at its common terminal. The select terminals of the display elements 42 are connected to corresponding gates line 41, and the data terminals of the display elements are connected to corresponding source lines 40 arrayed to extend in a direction which make the source lines cross the gate lines 41. In the gate lines 41, each line of the display elements 42 makes a display line; the thin film transistors 43 of the display elements 42 are turned on in units of display lines, whereby the display lines are selected (scan of the display lines). In each display line select period (horizontal display period), gradation drive signals according to display data are provided from the source lines 40 to the display elements 42. The gradation drive signals are voltage signals selected from gradation voltages according to the display data. After the thin film transistor 43 is turned off, the signal charge of the gradation drive signal applied to each display element 42 is held by the capacitance formed between the liquid crystal electrodes of each liquid crystal 44, and the capacitance 45, to maintain the shutter state of the liquid crystal until the display line is selected next time.

The touch panel 8 has scan electrodes sequentially scan-driven, and detection electrodes arranged so as to cross the scan electrodes, and it has a given capacitance component (detected capacitance) formed in each crossing part between the electrodes crossing each other. In sequentially driving the scan electrodes, the electric charge arising on each detection electrode is varied according to a change in electrostatic capacitance, depending on whether or not an object (e.g. a finger) is located in the vicinity of a scan electrode being driven. The information of the electric charge is integrated for each scan, and the difference in signal charge thus integrated will be utilized as a touch detection signal.

The LCD drive IC 3 has: an input/output circuit 6 interfaced with the host device 2; a display controller 4; a touch controller 5; a register circuit 10; a control circuit 11; and an OD (overdrive) signal-producing circuit 12. The reference numerals 25, 26, 33 and 34 are external terminals representatively shown.

The input/output circuit 6 accepts the input of commands, including a display control command and a touch control command, and control data CNTD from the host device 2, and stores the commands in a command register (CMDREG) 14, and the control data in a control register (CNTREG) 13.

The control circuit 11 controls the action of the LCD drive IC 3 based on input commands and control data. The display controller 4 stores image data DSPD supplied the host device 2 in an image memory. When directed to perform a display action, the display controller 4 causes the gate signal generation circuit 23 to produce select signals for sequentially selecting the display lines in synchronization with a display timing and in parallel, the source signal generation circuit 21 to produce source signals for driving the source lines based on image data in the image memory. The gate driver 24 selects the display line based on the select signal. Then, the source driver 22 drives the source lines 40 of the liquid crystal display panel 7 according to source signals in synchronization therewith. In this way, brightness signals are sequentially written into pixels of display lines in synchronization with the horizontal synchronization period in the respective vertical synchronization periods in units of frames in the liquid crystal display panel 7. The reference numeral 26 represents an external terminal (source line-driving terminal) connected to the source lines of the liquid crystal display panel 7, serving as an externally-supplying terminal of source line drive signals output from the source driver 22.

The control circuit 10 controls the action of the touch controller 5 based on commands and control data input thereto. The touch controller 5 causes the electrode drive signal generation circuit 30 to produce drive signals for the scan and detection electrodes in synchronization with a display timing, causes the electrode driver 31 to supply the detection electrodes with an initial potential, and to drive the scan electrodes, and causes the touch detection circuit 32 to integrate charge signals depending on electrostatic capacitances in the vicinities of intersection points of the scan and detection electrodes for each detection electrode; the integrated data are accumulated for each scan frame, which are provided to the host device 2 as touch detection data TCHD. The host device 2 makes calculation for the presence or absence of a touch and touch coordinates based on the touch detection data TCHD thus provided for each scan frame; the result is utilized in subsequent data processing.

The source driver 22 has buffer amplifiers 50 disposed for the source lines 40 respectively. For the buffer amplifiers 50, any one of the overdrive amplifiers AMP_1 to AMP_8, which have been described above, is adopted. The OD signal-producing circuit 12 produces an overdrive control signal OD and bias signals such as p_bs1 and n_bs1, and supplies them to the buffer amplifiers 50. For instance, a cycle typified by the times t0 to t3 in FIG. 2 is a cycle for driving the source lines for each display line in synchronization with a horizontal synchronization cycle. The periods A and B are variably defined by control data set on the control register 13. The control circuit 11 reads the control data from the control register 13, and provides a timing signal for producing the overdrive control signal OD to the OD signal-producing circuit 12 so as to ensure the times A and B in synchronization with the horizontal synchronizing signal cycle. In addition, control data for specifying voltage levels of the bias signals p_bs1 and n_bs1 are set on the control register 13. The control circuit 11 reads the control data from the control register 13, and provides signals for specifying the voltage levels of the bias signals p_bs1 and n_bs1 to the OD signal-producing circuit 12, whereby the OD signal-producing circuit 12 is caused to synchronize to the display timing of the liquid crystal display panel 7. In this way the overdrive action of the overdrive amplifier is controlled. Especially, regulating the period A of FIG. 2, defining an overdrive start timing, an inrush current into the liquid crystal display panel 7 at the time of starting the source driving can be suppressed.

Use of the LCD drive IC 3 enables the minimization of the difference in convergence time between near and far ends of a source line load of the liquid crystal display panel 7 mounted on a tablet, a smartphone, or the like. Also, it enables the regulation of the drive voltage level thereof. The amount of overdriving can be self-regulated by the bias currents Ip and In according to a driving voltage width. Therefore, the circuit scale is never increased, and the excess overdriving can be avoided. With a liquid crystal display panel mounted on a tablet, a smartphone or the like and advanced toward a higher definition, the pixel driving which is low in power consumption, higher in speed and superior in responsiveness can be realized without increasing the circuit scale.

While the invention made by the inventor has been specifically described above based on the embodiments thereof, the invention is not limited to the embodiment. It is obvious that various kinds of changes and modifications may be made without departing from the subject matter thereof.

For instance, the basic structure of the differential amplifier is not limited to the above description, and it can be changed appropriately. Further, it is possible to adopt a source follower output form limited to a push-pull circuit for e.g. the output circuit. In regard to the overdrive circuit, various kinds of changes and modifications may be made on its circuit connection form as long as the bias currents can be caused to flow selectively. In addition, as to the power source, the invention is not limited to such an embodiment that a positive high-potential power source Vdd and a negative low-potential power source Vss are used. It may be arranged so as to use a combination of the ground GND and Vdd, or a combination of the ground and Vss.

The overdrive amplifier according to the invention is not limited to an application to an LCD drive IC. It may be applied to various uses in which a load is driven. It is obvious that the overdrive amplifier can be applied not only to such a use that overdrive amplifiers are operated in parallel, but also to such a use that an overdrive amplifier drives a load alone.

What is claimed:

1. An overdrive amplifier comprising:
   a differential input circuit comprising differential input transistor pairs arranged by connecting, in a folded-cascode style, input transistors supplied with an input signal at respective first gates, and feedback input transistors configured to accept a feedback of an output signal at respective second gates;
   a current mirror load comprising mirror input current paths connected to current paths of the feedback input transistors and mirror output current paths connected to current paths of the input transistors;
   an output circuit configured to receive output control signals from the mirror output current paths of the current mirror load, wherein the output circuit has output transistors receiving the output control signals at respective third gates; and
   an overdrive circuit configured to generate bias currents which boost an output of the output circuit, depending on the output control signals, to pass through the current mirror load based on the output control signals during an overdrive period, wherein the overdrive circuit comprises overdrive transistors controlled in mutual conductance based on the output control signals, and switch transistors connected in series with the overdrive transistors, which are turned on in the overdrive period; and
   the overdrive circuit is configured to generate each bias current to pass through at least one of the mirror input current paths of the current mirror load with a corresponding one of the switch transistors in an ON state.

2. The overdrive amplifier according to claim 1, wherein the overdrive circuit further includes bias transistors connected in series with the overdrive transistors, and
   the bias transistors have mutual conductances determined according to voltages of respective bias signals supplied at their gates.

3. The overdrive amplifier according to claim 2, wherein the current mirror load includes a pMOS current mirror circuit connected between a floating current source and a high-potential power source, and an nMOS current mirror circuit connected between the floating current source and a low-potential power source,
   the pMOS current mirror circuit comprising a pMOS mirror input transistor and a pMOS mirror output transistor which comprise respective fourth gates connected commonly and which are composed of p-channel type MOS transistors respectively, provided that the gate and drain of the pMOS mirror input transistor are connected to each other,
   the nMOS current mirror circuit comprises an nMOS mirror input transistor and an nMOS mirror output transistor which comprise respective fifth gates connected commonly and which are composed of n-channel type MOS transistors respectively, provided that the gate and drain of the nMOS mirror input transistor are connected to each other, and
   the output circuit comprises a push-pull output circuit arranged by connecting a pMOS output transistor composed of a p-channel type MOS transistor comprising a gate connected to a drain of the pMOS mirror output transistor of the pMOS current mirror circuit, and an nMOS output transistor composed of an n-channel type MOS transistor having a gate connected to a drain of the nMOS mirror output transistor of the nMOS current mirror circuit, in series with each other.

4. The overdrive amplifier according to claim 3, wherein the overdrive circuit has a pMOS overdrive circuit connected between the drain of the pMOS mirror input transistor included in the pMOS current mirror circuit, and the high-potential power source, and an nMOS overdrive circuit connected between the drain of the nMOS mirror input transistor included in the nMOS current mirror circuit, and the low-potential power source, the pMOS overdrive circuit comprising a pMOS overdrive transistor, a pMOS switch transistor and a pMOS bias transistor which are formed by p-channel type MOS transistors as the pMOS overdrive transistor, the pMOS switch transistor and the pMOS bias transistor, respectively, and the nMOS overdrive circuit comprises, as the pMOS overdrive transistor, the pMOS switch transistor and the pMOS bias transistor, an nMOS overdrive transistor, an nMOS switch transistor and an nMOS bias transistor which are formed by n-channel type MOS transistors, respectively.

5. The overdrive amplifier according to claim 4, wherein the pMOS switch transistor of the pMOS overdrive circuit accepts an input of an inverted signal of an overdrive control signal at its gate, and the nMOS switch transistor of the nMOS overdrive circuit accepts an input of the overdrive control signal at its gate.

6. The overdrive amplifier according to claim 4, wherein the pMOS switch transistor of the pMOS overdrive circuit accepts an input of a logical OR signal of an inverted signal of an overdrive control signal and a first switch control signal at its gate, the nMOS switch transistor of the nMOS overdrive circuit accepts an input of a logical AND signal of the overdrive control signal and a second switch control signal at its gate, the first switch control signal is a signal synchronously changing earlier than a gate signal of the pMOS output transistor composed of the p-channel type MOS transistor, and the second switch control signal is a signal synchronously changing earlier than a gate signal of the nMOS output transistor composed of the n-channel type MOS transistor.

7. The overdrive amplifier according to claim 4, wherein the differential input circuit comprises, as the differential input transistor pairs, a pMOS differential input transistor pair connected between the high-potential power source and the nMOS current mirror circuit, and an nMOS differential input transistor pair connected between the low-potential power source and the pMOS current mirror circuit, the pMOS differential input transistor pair comprises, as one of the input transistors and the feedback input transistors, a pMOS input transistor and a pMOS feedback input transistor which are composed of p-channel type MOS transistors, respectively, the pMOS input transistor has a drain connected to the drain of the nMOS mirror output transistor, and the pMOS feedback input transistor has a drain connected to the drain of the nMOS mirror input transistor, the nMOS differential input transistor pair comprises, as one of the input transistors and the feedback input transistors, an nMOS input transistor and an nMOS feedback input transistor which are composed of n-channel type MOS transistors respectively, and the nMOS input transistor has a drain connected to the drain of the pMOS mirror output transistor, and the nMOS feedback input transistor has a drain connected to the drain of the pMOS mirror input transistor.

8. The overdrive amplifier according to claim 4, wherein one of the differential input transistor pairs of the differential input circuit is a pMOS differential input transistor pair connected between the high-potential power source and the nMOS current mirror circuit, the pMOS differential input transistor pair comprises, as one of the input transistors and the feedback input transistors, a pMOS input transistor and a pMOS feedback input transistor composed of p-channel type MOS transistors, respectively, the pMOS input transistor has a drain connected to the drain of the nMOS mirror output transistor, and the pMOS feedback input transistor has a drain connected to the drain of the nMOS mirror input transistor.

9. The overdrive amplifier according to claim 4, wherein one of the differential input transistor pairs of the differential input circuit comprises an nMOS differential input transistor pair connected between the low-potential power source and the pMOS current mirror circuit, the nMOS differential input transistor pair comprises, as one of the input transistors and the feedback input transistor, an nMOS input transistor and an nMOS feedback input transistor composed of n-channel type MOS transistors, respectively, the nMOS input transistor has a drain connected to the drain of the pMOS mirror output transistor, and the nMOS feedback input transistor has a drain connected to the drain of the pMOS mirror input transistor.

10. The overdrive amplifier according to claim 3, wherein the overdrive circuit comprises an nMOS overdrive circuit connected between the drain of the pMOS mirror input transistor included in the pMOS current mirror circuit and the low-potential power source, and a pMOS overdrive circuit connected between the drain of the nMOS mirror input transistor included in the nMOS current mirror circuit and the high-potential power source, the pMOS overdrive circuit comprises, as one of the overdrive transistors, one of the switch transistors and one of the bias transistors, a pMOS overdrive transistor, a pMOS switch transistor and a pMOS bias transistor formed by p-channel type MOS transistors, respectively, and the nMOS overdrive circuit comprises, as one of the overdrive transistors, one of the switch transistors and one of the bias transistors, an nMOS overdrive transistor, an nMOS switch transistor and an nMOS bias transistor formed by n-channel type MOS transistors respectively.

11. The overdrive amplifier according to claim 10, wherein the pMOS switch transistor of the pMOS overdrive circuit is configured to receive an input of an inverted signal of an overdrive control signal at its gate, and the nMOS switch transistor of the nMOS overdrive circuit is configured to receive an input of the overdrive control signal at its gate.

12. The overdrive amplifier according to claim 10, wherein the pMOS switch transistor of the pMOS overdrive circuit is configured to receive an input of a logical OR signal of an inverted signal of an overdrive control signal and a first switch control signal at its gate, the nMOS switch transistor of the nMOS overdrive circuit is configured to receive an input of a logical AND signal of the overdrive control signal and a second switch control signal at its gate, the first switch control signal is a signal synchronously changing earlier than a gate signal of the pMOS output transistor composed of the p-channel type MOS transistor, and the second switch control signal is a signal synchronously changing earlier than a gate signal of the nMOS output transistor composed of the n-channel type MOS transistor.

13. The overdrive amplifier according to claim 10, wherein the differential input circuit comprises, as the differential input transistor pairs, a pMOS differential input transistor pair connected between the high-potential power source and the nMOS current mirror circuit, and an nMOS differential input transistor pair connected between the low-potential power source and the pMOS current mirror circuit, the pMOS differential input transistor pair comprises, as one of the input transistors and the feedback input transistors, a pMOS input transistor and a pMOS feedback input transistor composed of p-channel type MOS transistors, respectively, the pMOS input transistor has a drain connected to the drain of the nMOS mirror output transistor, the pMOS feedback input transistor has a drain connected to the drain of the nMOS mirror input transistor, the nMOS differential input transistor pair comprises, as one of the input transistors and the feedback input transistors, an nMOS input transistor and an nMOS feedback input transistor composed of n-channel type MOS transistors, respectively, the nMOS input transistor has a drain connected to the drain of the pMOS mirror output transistor, and the nMOS feedback input transistor has a drain connected to the drain of the pMOS mirror input transistor.

14. The overdrive amplifier according to claim 10, wherein one of the differential input transistor pairs of the differential input circuit comprises a pMOS differential input transistor pair connected between the high-potential power source and the nMOS current mirror circuit, the pMOS differential input transistor pair comprises, as one of the input transistors and the feedback input transistors, a pMOS input transistor and a pMOS feedback input transistor composed of p-channel type MOS transistors respectively, the pMOS input transistor has a drain connected to the drain of the nMOS mirror output transistor, and the pMOS feedback input transistor has a drain connected to the drain of the nMOS mirror input transistor.

15. The overdrive amplifier according to claim 10, wherein one of the differential input transistor pairs of the differential input circuit comprises an nMOS differential input transistor pair connected between the low-potential power source and the pMOS current mirror circuit, the nMOS differential input transistor pair comprises, as one of the input transistors and the feedback input transistors, an nMOS input transistor and an nMOS feedback input transistor composed of n-channel type MOS transistors respectively, the nMOS input transistor has a drain connected to the drain of the pMOS mirror output transistor, and the nMOS feedback input transistor has a drain connected to the drain of the pMOS mirror input transistor.

16. A semiconductor device formed on a semiconductor substrate, comprising a plurality of overdrive amplifiers operated in parallel, wherein the overdrive amplifiers each comprise: a differential input circuit comprising differential input transistor pairs arranged by connecting, in a folded-cascode style, input transistors supplied with an input signal at respective first gates and feedback input transistors accepting a feedback of an output signal at respective second gates;

a current mirror load comprises mirror input current paths connected to current paths of the feedback input transistors, and mirror output current paths connected to current paths of the input transistors;

an output circuit configured to receive the input of output control signals from the mirror output current paths of the current mirror load, wherein the output circuit comprises output transistors receiving the output control signals at respective third gates; and an overdrive circuit configured to generate bias currents which boost an output of the output circuit, depending on the output control signals, to pass through the current mirror load based on the output control signals during an overdrive period, the overdrive circuit comprising overdrive transistors controlled in mutual conductance based on the output control signals, and switch transistors connected in series with the overdrive transistors respectively, which are turned on in the overdrive period, and the overdrive circuit is configured to generate each bias current to pass through at least one of the mirror input current paths of the current mirror load with the corresponding switch transistor in ON state.

17. The semiconductor device according to claim 16, further comprising a control register, wherein the overdrive circuit further comprises bias transistors connected in series with the overdrive transistors, respectively, the bias transistors have mutual conductances determined according to voltages of respective bias signals supplied at their gates, and control data determining voltages of the respective bias signals are overwritably set in the control register.

18. The semiconductor device according to claim 17, further comprising a source driver operable to output gradation voltage signals according to display data in parallel in synchronization with a display timing, wherein the source driver comprises the plurality of overdrive amplifiers, and each overdrive amplifier comprises a buffer amplifier operable to output a respective one of the gradation voltage signals from a corresponding external terminal to outside the semiconductor device.

* * * * *

UNITED STATES PATENT AND TRADEMARK OFFICE
CERTIFICATE OF CORRECTION

PATENT NO. : 10,157,585 B2
APPLICATION NO. : 15/349255
DATED : December 18, 2018
INVENTOR(S) : Yutaka Saeki It is certified that error appears in the above-identified patent and that said Letters Patent is hereby corrected as shown below:

In the Claims

Column 24, Line 17, In Claim 9, delete "transistor," and insert -- transistors, --, therefor.

Signed and Sealed this
Twenty-first Day of April, 2020

Andrei Iancu
*Director of the United States Patent and Trademark Office*